United States Patent
Bessonov et al.

(10) Patent No.: US 11,069,826 B2
(45) Date of Patent: Jul. 20, 2021

(54) PHOTOSENSITIVE DEVICE WITH ELECTRIC SHUTTER

(71) Applicant: EMBERION OY, Espoo (FI)

(72) Inventors: Alexander Bessonov, Cambridge (GB); Alan Colli, Cambridge (GB); Mark Allen, Cambridge (GB)

(73) Assignee: EMBERION OY, Espoo (FI)

(*) Notice: Subject to any disclaimer, the term of this patent is extended or adjusted under 35 U.S.C. 154(b) by 117 days.

(21) Appl. No.: 16/361,473

(22) Filed: Mar. 22, 2019

(65) Prior Publication Data
US 2019/0296178 A1    Sep. 26, 2019

(30) Foreign Application Priority Data
Mar. 22, 2018 (GB) .................................. 1804607

(51) Int. Cl.
*H01L 31/113* (2006.01)
*G01J 1/44* (2006.01)
(Continued)

(52) U.S. Cl.
CPC ............ *H01L 31/1136* (2013.01); *G01J 1/44* (2013.01); *H01L 31/028* (2013.01); *H01L 31/035281* (2013.01)

(58) Field of Classification Search
CPC ......... H01L 31/1136; H01L 31/035281; H01L 31/028; H01L 31/1121; H01L 31/0264;
(Continued)

(56) References Cited

U.S. PATENT DOCUMENTS

| | | |
|---|---|---|
| 2016/0366354 A1 | 12/2016 | Konstantatos et al. |
| 2017/0041564 A1 | 2/2017 | Konstantatos et al. |
| 2020/0132544 A1* | 4/2020 | Koppens ............... H04N 5/357 |

FOREIGN PATENT DOCUMENTS

| | | |
|---|---|---|
| EP | 3 147 954 A1 | 3/2017 |
| EP | 3 236 653 A1 | 10/2017 |

(Continued)

OTHER PUBLICATIONS

S. Goossens et al., "Broadband image sensor array based on graphene-CMOS integration", Nature Photonics, vol. 11, 366 (2017); whole document.

(Continued)

*Primary Examiner* — Thanh Luu
*Assistant Examiner* — Monica T Taba
(74) *Attorney, Agent, or Firm* — Squire Patton Boggs (US) LLP

(57) ABSTRACT

A photosensitive transistor or voltage-mode device which comprises a gate electrode, a layer of ambipolar two-dimensional material such as graphene and a layer of photoactive semiconducting material forms a junction with the ambipolar two-dimensional material. The photoactive semiconducting material and the ambipolar two-dimensional material are configured so that there is a non-screening gate voltage interval where an interface voltage at the junction between the photoactive semiconducting layer and the ambipolar two-dimensional material can be changed by applying to the gate electrode a gate voltage which falls within the non-screening gate voltage interval. The non-screening gate voltage interval comprises a flat-band gate voltage at which the interface voltage is zero. An electrical shutter can be operated at this gate voltage.

9 Claims, 14 Drawing Sheets

(51) Int. Cl.
*H01L 31/0352* (2006.01)
*H01L 31/028* (2006.01)

(58) Field of Classification Search
CPC ...... G01J 1/44; G01J 1/42; G01J 1/044; G01J 1/0209; H04N 5/357
See application file for complete search history.

(56) References Cited

FOREIGN PATENT DOCUMENTS

| | | |
|---|---|---|
| EP | 3 240 044 A1 | 11/2017 |
| EP | 3 249 908 A1 | 11/2017 |
| EP | 3 252 831 A1 | 12/2017 |
| EP | 3429190 A1 | 1/2019 |
| WO | 2013017605 A1 | 2/2013 |

OTHER PUBLICATIONS

G. Wang et al., "Two dimensional materials based photodetectors", Infrared Physics & Technology, vol. 88, 149 (Jan. 2018); abstract; section 1 with table 1, and sections 2.2-2.4, with references therein.
C. Xie et al., "Photodetectors Based on Two-Dimensional Layered Materials Beyond Graphene", Advanced Functional Materials, vol. 27, 1603886 (2017); abstract; section 3.4 and table 3, with references therein.
May 24, 2019 International Search Report issued in International Patent Application No. PCT/FI2019/050227.
GB Search Report dated Sep. 17, 2018 corresponding to GB Application No. GB1804607.8.

* cited by examiner

Accumulation (n-type)

Depletion (n-type)

Inversion (n-type)

PHOTOSENSITIVE DEVICE WITH ELECTRIC SHUTTER

FIELD OF THE DISCLOSURE

This disclosure relates to photosensitive devices prepared on the surface of a substrate, and more particularly to devices which can be used for detecting the intensity of electromagnetic radiation. The present disclosure further concerns methods for measuring electromagnetic radiation with such devices, and methods for resetting such devices between successive measurements.

BACKGROUND OF THE DISCLOSURE

Field-effect transistors which utilize two-dimensional materials in the transistor channel, and voltage-mode devices which utilize two-dimensional materials as sensing electrodes can be used as versatile detectors of electromagnetic radiation at wavelengths ranging from infrared to ultraviolet. Such devices may be called photosensitive devices. A graphene field-effect transistor (GFET), for example, comprises a semiconducting graphene channel. Its conductivity can be measured, and strongly amplified, in a field-effect transistor geometry where the current through the channel is controlled by a gate voltage applied to the gate electrode.

The conductivity of graphene changes under illumination, but only a small part of incident radiation is absorbed in graphene. The sensitivity of graphene-based photosensitive devices can be increased by placing a semiconducting photoactive layer adjacent to the graphene layers. Such photoactive layers can donate extra charge carriers to the graphene layer, or change the potential of the graphene layer, when charge carriers are released in the photoactive material by electromagnetic radiation. This effect may be called charge modulation. The same effect can be generated in other two-dimensional materials. Photoactive layers can also expand the spectral response of photosensitive devices to a broader wavelength range.

Photodetectors typically use correlated double-sampling (CDS) to reduce noise in the measurement of radiation intensity. CDS is particularly important for reducing flicker noise (1/f noise). The CDS method includes one measurement of detector response under illumination and another measurement of detector response when it is not illuminated. In order for the CDS-method to be useful, the noise conditions should be as equal as possible in these two measurements. The measurement under illumination should therefore be conducted as soon as possible after the corresponding non-illuminated measurement, or vice versa.

US2017041564 discloses a photodetector comprising multiple photosensitive field-effect transistors. Each pixel comprises one photoactive element and one reference element. The reference element is covered by a light-blocking layer. Illuminated and non-illuminated sensor responses are measured from the photoactive element and the reference element, respectively. However, it is not an optimal solution to prepare two separate elements in one pixel. It would be preferable to have use only one field-effect transistor per pixel.

To generate illuminated and non-illuminated states in quick succession in one transistor, a shutter mechanism is needed. A mechanical shutter can be placed on top of any transistor to modulate incident light on and off. However, there are many photodetector applications where mechanical shutters are not feasible. Furthermore, mechanical shutters can often only perform an incomplete reset. If charge dissipation occurs with a time-constant longer than the dark period, the effects of light exposure in one frame may be carried over to both dark and light states in subsequent frames.

BRIEF DESCRIPTION OF THE DISCLOSURE

An object of the present disclosure is to provide an electrical shutter for photosensitive devices which utilize two-dimensional channel materials in contact with semiconducting photoactive layers. An electric shutter switches the device from a light-sensitive state to a light-immune state with an electrical signal, such as a voltage. No separate light-blocking elements are needed when an electric shutter is used.

The objects of the disclosure are achieved by the arrangement and method which are characterized by what is stated in the independent claims. The preferred embodiments of the disclosure are disclosed in the dependent claims.

The disclosure is based on the fact that certain two-dimensional materials, such as graphene, demonstrate ambipolar conduction. Voltages applied through a gate electrode to a graphene field-effect transistor can therefore switch its carrier type from p-type to n-type and vice versa. It is also based on the realization that an insulated gate electrode can influence the interface voltage of the junction between the graphene layer and the photoactive layer, due to the limited number of energy states near the charge neutrality point in graphene. This allows the gate voltage to simultaneously change both the conduction type of the graphene layer and the interface voltage. The disclosure is further based on the surprising discovery that, if the graphene layer and the photoactive layer are prepared with suitable properties, the charge neutrality point of the graphene layer will lie at a gate voltage which allows an electrical shutter function to be performed by the gate electrode.

This electrical reset always resets a photosensitive transistor pixel to a known electrical state, so that even non-ideal effects with long time-constants are quickly neutralized. The reset time is short, which facilitates the use of the CDS method and a high frame rate in light detection applications.

BRIEF DESCRIPTION OF THE DRAWINGS

In the following the disclosure will be described in greater detail by means of preferred embodiments with reference to the accompanying drawings, in which.

THEORETICAL BACKGROUND

Figure 1A:
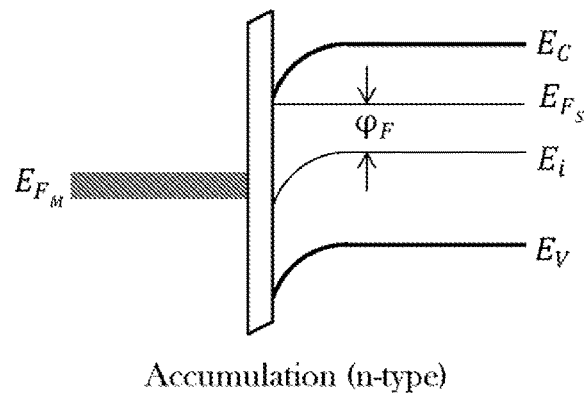
FIGS. 1a-1d illustrate the theoretical background of the invention.

The electrical properties of ambipolar two-dimensional materials, such as graphene, and photoactive semiconducting materials, such as colloidal semiconductor nanocrystals, can be configured in such a way that a first bias voltage induces p-type conduction in the ambipolar material and a highly depleted semiconducting material, whereas a second bias voltage induces n-type conduction in the ambipolar material and a flat-band condition at the semiconductor-2D material interface. When this configuration is established, a measurement can be conducted in light signal capture mode at the first bias voltage, and in shutter mode at the second bias voltage.

Throughout this disclosure, graphene will be used as the primary example of an ambipolar two-dimensional material. However, other ambipolar two-dimensional materials will also be listed in the detailed description below.

Graphene is a two-dimensional semimetal where the Fermi level ($E_F$) changes, with respect to the Dirac point, in proportion to the square root of the carrier density (n), an excess of electrons or holes (see for example, A. D. Bartolomeo; Schottky diodes: An Experimental Review of the Rectifying Graphene/Semiconductor Heterojunction; Physics Reports 2016, vol 606, p. 1-58):

$$E_F = \mp \frac{h}{2\sqrt{\pi}} v_F \sqrt{n}$$

where $v_F$ is a Fermi velocity, and the − and + signs correspond to p and n-type graphene, respectively. Therefore, an external electric field, which creates direct charge injection/transfer from chemical impurities or materials in contact with graphene, induces a shift in the graphene Fermi level. Assuming that the density of carriers per unit area induced in graphene by the application of a voltage V (Δn) is much smaller than the carrier density at zero bias (no), a change of the Fermi level can be expressed as $$\Delta E_F(V) = \frac{h}{4\sqrt{\pi}} v_F \frac{\Delta n}{\sqrt{|n_0|}}$$

When a layer of graphene is interfaced with a semiconductor, for example in a graphene-quantum dot junction, this possibility of controlling the position of the Fermi level and charge carrier density in graphene allows the Schottky barrier height and the rectification properties of the junction to be tuned. Even when the adjacent gate electrode and the semiconductor/graphene junction are on opposite sides of the graphene layer, an electric field induced by the gate electrode can set a voltage bias over the junction if the graphene layer is in a non-screening state near its charge neutrality point, where the limited number of energy states near the Dirac condition restricts its conductivity. In other words, when the electric field is not screened by the graphene layer, it does not terminate in the graphene layer (as it would in a layer of perfectly conducting metal or in a graphene layer biased far from its charge neutrality point), but influences the junction. The gate voltage ($V_g$) may then be distributed throughout the structure as follows $V_0 = \phi_{semiconductor} + \phi_{graphene} + \phi_{insulator}$, where "insulator" refers to a gate insulator which may separate the graphene layer from the gate electrode.

Figure 1B:
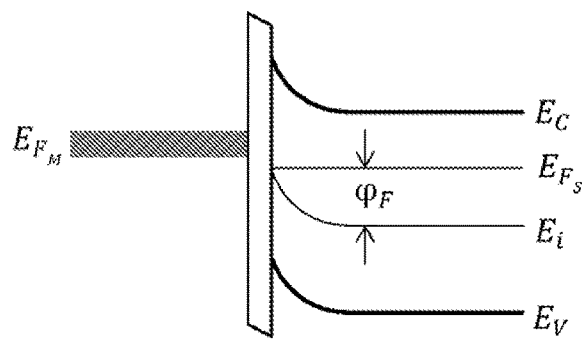
Figure 1C:
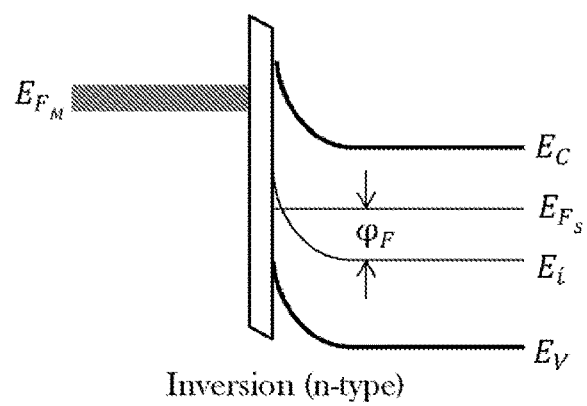

FIGS. 1a-1c illustrate the properties of a classic metal-oxide-semiconductor structure, with an n-type semiconductor, when different gate voltages are applied to the metallic gate electrode. The junction between graphene and an n-type semiconductor may exhibits analogous electric behaviour when the electric field is not screened by the graphene layer.

For the n-type semiconductor (11), illustrated in FIG. 1a, when $V_g > 0$, the metal (14) Fermi energy is lowered (E=−qV), so the insulator (13) has an electric field across which is distributed over a finite distance in the semiconductor (11). The charge model indicates that negative charge (in the form of electrons) must be created in the semiconductor. Since $n = n_i \exp[(E_F - E_i)/kT]$, the electron concentration at the interface increases. This may be called the accumulation regime of the junction.

When $V_g < 0$, the metal (14) Fermi energy is raised (E=−qV), as illustrated in FIG. 1b. Similarly, the electric field penetrates the semiconductor (11), inducing the positive charge at the interface. However, this charge is now in the form of ionized donors. Since $n = n_i \exp[(E_F - E_i)/kT]$, the electron concentration near the interface decreases. This may be called the depletion regime of the junction.

As illustrated in FIG. 1c, for higher magnitudes of bias ($V_g \ll 0$) the Fermi-level near the interface crosses the intrinsic energy ($E_i$) and the material locally changes from n-type to p-type near the interface. The charge model indicates that positive charge continues to accumulate in the semiconductor near the interface. Now, this charge is in the form of both ionized donors and holes. The hole concentration near the interface must equal the donor concentration. This may be called the inversion regime of the junction, and its onset occurs at a gate voltage which may be called the threshold voltage $V_T$.

Charge due to accumulation bias and inversion bias results in a very narrow charge distribution near the interface. Charge due to depletion bias results in a wider depletion width W, which can be determined by equation (1):

$$W = \sqrt{\phi_S \frac{2\varepsilon_s}{q|N_A - N_D|}} \quad (1)$$

where $\phi_S$ is the electrostatic potential at the semiconductor interface, $N_A$ ($N_0$) is the acceptor (donor) density, and to is the relative permittivity of the semiconductor. The depletion width at the inversion-depletion transition (maximum depletion width), $W_T$, can be found by noting that the surface potential is twice the bulk Fermi potential $\phi_{S=}2\phi_F$.

$$W_T = \sqrt{2\phi_F \frac{2\varepsilon_s}{q|N_A - N_D|}} = \sqrt{\frac{4\varepsilon_s kT}{q^2|N_A - N_D|} \ln\left(\frac{|N_A - N_D|}{n_i}\right)}$$

In inversion and accumulation, the vast majority of the gate voltage drops across the insulator. In inversion, the depletion width remains nearly constant. Thus, $\phi_S$ can't be much less (greater) than 0 for a p-type (n-type) semiconductor, and $\phi_S$ can't be much greater (less) than $2\phi_F$ for a p-type (n-type) semiconductor.

Figure 1D:
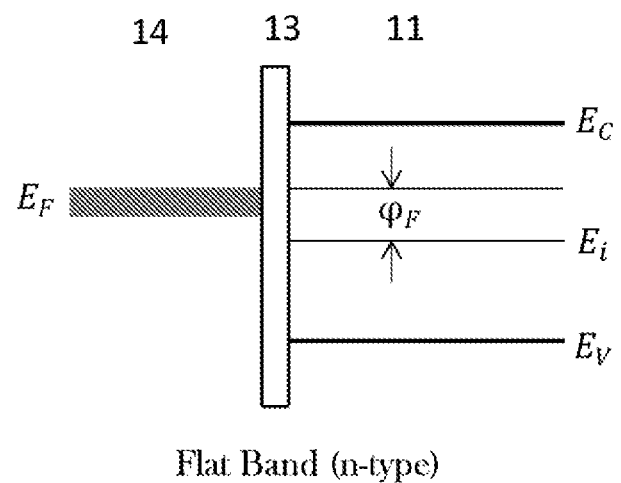

The flat-band regime (W=0), illustrated in FIG. 1d, is a condition with zeroed interface voltage between the semiconductor and the graphene layer. In a typical MOS, this occurs when $V_g = 0V$, but with the graphene layer in between the semiconductor and dielectric, the flat-band $V_g$ may differ from zero, because there might be an equilibrium build-up of electrostatic potential in the structure due to the work function mismatch.

In other words, there is a threshold gate voltage $V_T$ where the junction between a graphene layer and a photoactive semiconducting layer turns from the inversion regime to the depletion regime. The interface voltage exhibits a local maximum at this threshold gate voltage. There is also a flat-band gate voltage where the interface voltage becomes zero, and this flat-band gate voltage falls in the range where the junction turns from the depletion regime to the accumulation regime. The interface voltage is non-zero at any other gate voltage than the flat-band gate voltage.

If the photoactive semiconducting material is an n-type material, as in the preceding example, the threshold gate voltage will be negative. The flat-band gate voltage is in this case always greater than the threshold voltage, but it may be either positive or negative depending on the magnitude of the built-in voltage at the graphene/semiconductor junction. If the photoactive semiconducting material is a p-type material, the threshold gate voltage will be positive. The flat-band gate voltage is in this case smaller than the threshold gate voltage, and again it may be either positive or negative.

In other words, the mutual ordering of the inversion, depletion and accumulation regimes as a function of gate voltage depends on the doping type of the photoactive semiconducting material. For reasons of simplicity, inversion/depletion/accumulation will be illustrated only for an n-type photoactive semiconducting material in the subsequent parts of this disclosure, but statements regarding the material are directly applicable to p-type photoactive semiconducting materials as well.

DETAILED DESCRIPTION OF THE DISCLOSURE

This disclosure describes a photosensitive device which can be configured to provide an electrical response when illuminated by electromagnetic radiation incident on the device. The device comprises at least one substantially horizontal, electrically conducting gate electrode which defines a first region on a substrate surface, a substantially horizontal layer of ambipolar two-dimensional material which overlies or underlies the at least one gate electrode across the first region. The device also comprises an insulating layer between the at least one gate electrode and the layer of ambipolar two-dimensional material across the first region. The device also comprises a substantially horizontal layer of photoactive semiconducting material which is in contact with and forms a junction with the layer of ambipolar two-dimensional material across the first region, and a control unit configured to apply a gate voltage to the gate electrode and to measure the electrical response of the photosensitive device from the ambipolar two-dimensional material.

The photoactive semiconducting material and the ambipolar two-dimensional material may be configured so that there is a non-screening gate voltage interval where an interface voltage at the junction between the photoactive semiconducting layer and the ambipolar two-dimensional material can be changed by applying to the gate electrode a gate voltage which falls within the non-screening gate voltage interval. The photoactive semiconducting material and the ambipolar two-dimensional material may also be configured so that the non-screening gate voltage interval comprises a flat-band gate voltage at which the interface voltage is zero, a depletion gate voltage range where the interface voltage is nonzero, and a charge-neutrality gate voltage at which the ambipolar two-dimensional material is at its charge-neutrality point. The photoactive semiconducting material and the ambipolar two-dimensional material may also be configured so that the depletion gate voltage range and the charge-neutrality gate voltage lie on the same side of the flat-band gate voltage on a gate voltage axis.

Alternatively, the photoactive semiconducting material and the ambipolar two-dimensional material may be configured so that the charge-neutrality gate voltage at which the ambipolar two-dimensional material is at its charge neutrality point lies between (1) the flat-band gate voltage at which the interface voltage is zero, and (2) a threshold gate voltage at which the interface voltage exhibits a local maximum.

The flat-band gate voltage is the gate voltage at which the junction between the ambipolar two-dimensional material and the photoactive semiconducting layer is at the limit between the depletion regime and the accumulation regime. The threshold gate voltage is the gate voltage at which the junction between the ambipolar two-dimensional material and the photoactive semiconducting layer is at the limit between the depletion regime and the inversion regime.

In this disclosure, the term "ambipolar" refers to ambipolar electrical conduction (ambipolar charge transport). An ambipolar material is a material which n-type conduction predominates when the material is subjected to an electric field of a first magnitude and/or direction, and p-type conduction predominates when the material is subjected to a bias voltage (electric field) of a second magnitude and/or direction. At a certain magnitude and direction of the bias voltage, the n-type and p-type conduction components are equal. The conductance of the ambipolar material exhibits at minimum at this point, which may be called the charge neutrality point of the ambipolar material. The corresponding gate voltage may be called the charge-neutrality gate voltage. When the bias voltage changes from the charge-neutrality gate voltage in either direction, one conduction type begins to dominate and the conductance (either n-type or p-type) of the ambipolar material becomes higher than at the charge neutrality point A curve which illustrates the conductance of an ambipolar material as a function of bias voltage may be called the conductance curve of the ambipolar material.

As mentioned above, an ambipolar material such as graphene screens an electric field if the conductance of the ambipolar material is sufficiently high. If an electric field is screened, only those material layers which lie on the same side of the ambipolar material as the source of the electric field (for example the gate electrode which applies a gate voltage to a graphene layer) are affected by the electric field. Materials and junctions on the opposite side of the ambipolar material are not affected.

However, the conductance of ambipolar two-dimensional materials may be configured to be so low at its charge-neutrality point that an electric field generated by a bias voltage from a gate electrode is not screened. Furthermore, the ambipolar two-dimensional material can be configured to exhibit sufficiently low conductivity to prevent screening, or at least prevent complete screening, within a certain gate voltage interval around the charge-neutrality gate voltage. This gate voltage interval may be labelled the "non-screening gate voltage interval". The breadth of this voltage interval depends on the slopes of the conductance curve in both directions.

Within the non-screening gate voltage interval, any given gate voltage applied to the gate electrode can be at least partly transmitted as a bias voltage also to the junction between the photoactive semiconducting material and the ambipolar two-dimensional material. This bias voltage alters the interface voltage at this junction. In this disclosure, the term "interface voltage" refers to the electrostatic potential difference between the ambipolar two-dimensional material and the edge of the depletion region in the photoactive semiconducting material. If the gate voltage is screened, the interface voltage is simply the built-in voltage of the junction. In the non-screening gate voltage interval, the interface voltage becomes a sum of the built-in voltage and the bias voltage provided by the gate electrode.

This disclosure describes a device where the photoactive semiconducting material and the ambipolar two-dimensional material are configured so that the non-screening gate voltage interval of the ambipolar two-dimensional material is at least partly aligned with the depletion regime of the junction. The operating principles based on this alignment are described in detail in the section "Operating principles" below.

Figure 2:
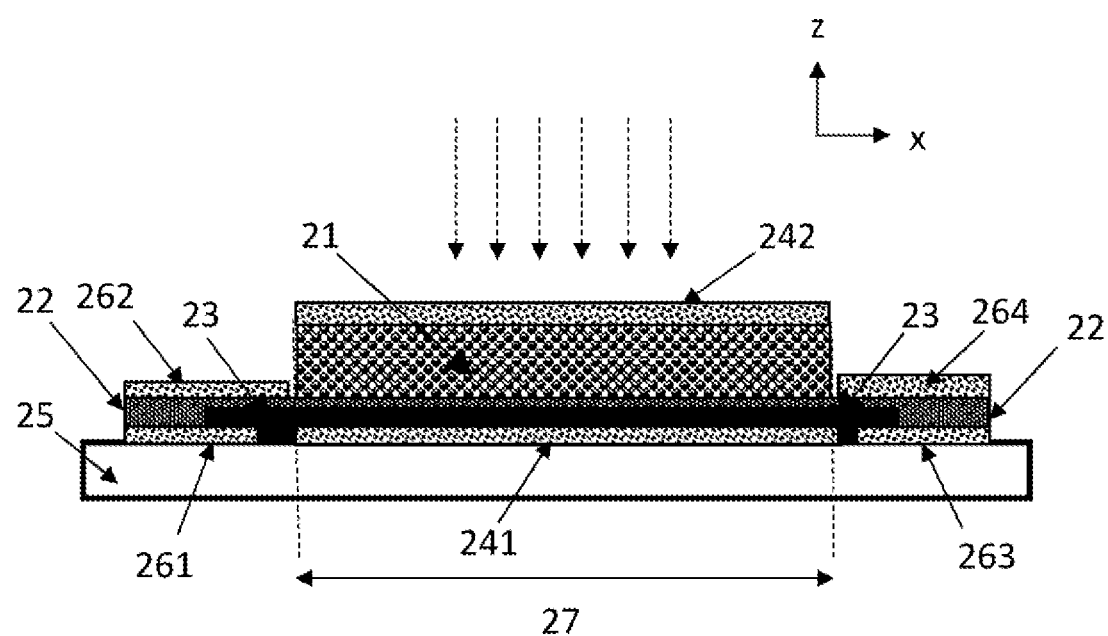
FIG. 2 illustrates a photosensitive device according to a first device embodiment.
Figure 3:
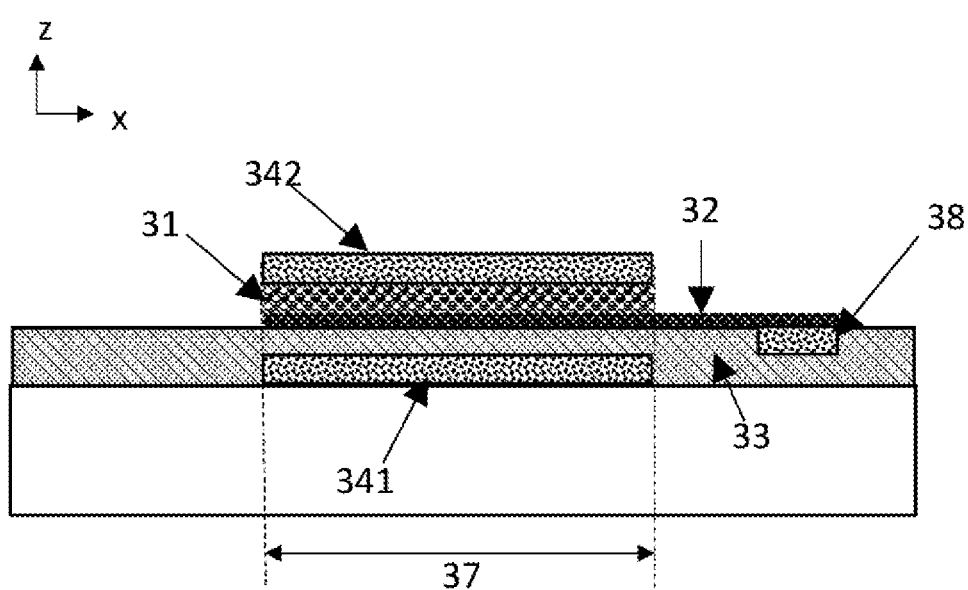
FIG. 3 illustrates a photosensitive device according to a second device embodiment.

In this disclosure, the term "horizontal" refers to the xy-plane, partially illustrated with the x-axis in FIGS. 2 and 3, while the term "vertical" refers to the z-direction. In this disclosure, expressions such as "substantially horizontal layer" mean that the primary orientation of that layer is determined by an underlying substrate plane. The layer may have been deposited over other layers which comprise small vertical steps, but nevertheless be substantially horizontal due to its primary orientation. Furthermore, terms such as "top," bottom", "vertical" and "horizontal" do not imply anything about the orientation of the substrate when the device is manufactured, or when the device is in use. The device and the substrate may be oriented in any suitable direction during usage and manufacturing, for example sideways in such a manner that a layer which is in this disclosure referred to as "horizontal", becomes vertical. In other words, the terms "horizontal" and "vertical" merely define two orthogonal directions, one of which is parallel to a substrate surface, and the other of which is normal to that surface.

In this disclosure, the verb "cover" refers to vertical alignment with direct contact. When a first layer "covers" a second layer on a given area, the first layer and the second layer are vertically aligned on this area, and they are in direct contact with each other. In other words, the two layers have been sequentially deposited on a given area of the substrate. They are vertically aligned because the second layer has been deposited on this area first, and then the first layer has been deposited on the same area. Within this area, the second layer therefore lies below the first layer in the vertical direction. The first layer "covers" the second layer in this area because no other layers lie between the first and the second layer.

The verb "cover", when used with no further qualifiers, refers to complete vertical alignment where no area of the second layer is uncovered by the first layer. Qualified expressions such as "partly cover" are used to refer to partial vertical alignment, where there is an area of the second layer which is not covered by the first layer. Qualified expressions such as "at least partly cover" are used to refer to vertical alignment which can be either complete or partial.

In this disclosure, the verbs "overlie" and "underlie" refer to vertical alignment without direct contact. When a first layer "overlies" or "underlies" a second layer on a given area, the first layer and the second layer are vertically aligned, but they are not in direct contact with each other. In other words, the two layers have both been deposited on a given area of the substrate, but a third intervening layer has been deposited between them. These three layers are all vertically aligned on this area.

In addition to direct physical contact, the term "in contact with" can in this disclosure in some contexts mean electrical contact without direct physical contact. In other words, when the photoactive layer, or a portion of the photoactive layer, is in contact with the sensing electrode, the photoactive layer can be physically separated from the sensing electrode by an intermediate layer, such as a specialised electron or hole transport/blocking layer, but still be in contact with the sensing electrode because the intermediate layer is sufficiently thin to allow charge carriers to pass through it. If charge carriers can pass through the intermediate layer, for example by tunnelling, then the photoactive layer may still be considered to be "in contact with" the sensing electrode.

A method for using the photosensitive device comprises the steps of exposing the photosensitive device to illumination, applying a capture voltage to the gate electrode, measuring a first value of the electric response at the capture gate voltage, and storing the first value of the electric response in a memory unit. The method further comprises the steps of applying a shutter voltage to the gate electrode, measuring a second value of the electric response at the shutter voltage, and storing the second value of the electric response in a memory unit. The method further comprises the steps of calculating the corrected response of the photosensitive device from the stored first value and the stored second value.

Examples of photosensitive device structures are given in the first and second device embodiments presented below. A photosensitive device according to either embodiment may form a pixel in a pixel array which comprises a multitude of similar photosensitive devices, and optionally also other photosensitive devices. A pixel array may be a part of a photodetector.

First Device Embodiment

The photosensitive device may be a transistor which comprises at least one electrically conducting source electrode and at least one electrically conducting drain electrode in contact with the ambipolar two-dimensional material. When the device is a transistor, the control unit may be configured to apply a source-drain voltage between the at least one source electrode and the at least one drain electrode. Alternatively, the control unit may be configured to measure the electric potential of the ambipolar two-dimensional material through the source electrode and/or the drain electrode.

FIG. 2 illustrates an exemplary photosensitive transistor according to this first device embodiment. The transistor comprises a layer of photoactive semiconducting material 21, a graphene channel 22, a gate insulator 23, a bottom gate electrode 241 and a top gate electrode 242. The transistor further comprises two source electrodes 261 and 262, and two drain electrodes 263 and 264. The device has been prepared on an underlying substrate 25. The gate electrodes 241 and 242 define a first region 27, where the graphene channel 22 overlies bottom gate electrode 241 and underlies top gate electrode 242. The layer 21 of photoactive semiconducting material covers the graphene channel across the first region 27. The graphene channel may extend outside of the first region, but the interface between the photoactive semiconducting material and the graphene channel does not extend beyond the first region. The insulating layer 23 is located between the gate electrode 241 and the graphene channel 22. The insulating layer 23 covers the gate electrode 241 in the first region 27, and the graphene channel 22 covers the insulating layer 23.

One gate electrode is sufficient for operating the device with a shutter functionality. Either gate electrode 241 or 242 may be used for this purpose, and one of them may then optionally be omitted. Alternatively, both gate electrodes 241 and 242 may be used simultaneously for operating the device.

If a top gate electrode is used, the top gate electrode 242 covers the photoactive semiconducting layer 21 in the first region. As insulating layer does not necessarily have to be placed between the top gate electrode and the photoactive semiconducting layer in this case. However, an insulating layer, which is not illustrated in FIG. 2, may optionally be placed between the top gate electrode 242 and the photoactive semiconducting layer 21. If a bottom gate electrode 241 is used, the graphene channel 22 may cover an insulating layer 23, and the insulating layer 23 may cover the bottom gate electrode 241.

An upside-down configuration, where the graphene channel covers the photoactive semiconducting layer, may also be employed. This structure has not been separately illustrated, but the photoactive semiconducting layer may then cover the bottom gate electrode, and an insulating layer may optionally be placed in between them. An insulating layer may cover the graphene channel in the first region, and the top gate electrode may cover this insulating layer.

In the exemplary embodiments presented in this disclosure, graphene is discussed as an example of an ambipolar two-dimensional material. However, other two-dimensional layered materials, such as phosphorene (black phosphorous), silicene, germanene, stanene, GaN, InN, InP, InAs, BAs, BP, or GaP, may also be used as an ambipolar two-dimensional material in any embodiment presented in this disclosure. Furthermore, the two-dimensional layered material used in any embodiment presented in this disclosure may also be a transition metal dichalcogenide or transition metal oxide, which includes $WE_2$, $MoE_2$, $ScEa$, $TiE_2$, $HfE_2$, $ZrE_2$, $VE_2$, $CrE_2$, $MnE_2$, $FeE$, $CoE_2$, $NiE_2$, $NbE_2$, $TcE_2$, $ReE_2$, $PdE_2$, or $PtE_2$, where E is O, S, Se or Te. The two-dimensional material may comprise 1-10 atomic layers, with the total thickness ranging from 0.3 nm to 10 nm.

All of these materials can be configured to exhibit the ambipolar properties described in this application and they can be interfaced with a photoactive semiconducting layer illuminated by electromagnetic radiation.

In the exemplary embodiments presented in this disclosure, semiconductor nanocrystals (quantum dots) are presented as one example of a photoactive material with semiconducting electric properties. These may include semiconductor nanocrystals or colloidal quantum dots selected from the group: PbS, PbSe, PbTe, CdS, CdSe, CdTe, ZnS, ZnO, CuS, CuaS, CuzSe, CZTS, MnS, $Bi_2S_3$, $Ag_2S$, $Ag_2Se$, HgTe, HgCdTe, GaSe, $MoS_2$, CIS, InAs, InSb, Ge, Si, graphene, or core/shell nanocrystals with any of the preceding core/shell constituents.

Alternatively, in any of the embodiments presented in this disclosure, the photoactive semiconducting layer may comprise any of the preceding semiconductor nanocrystals or colloidal quantum dots embedded in a host material comprising metal chalcogenide, metal halide, or hybrid halide perovsklte. The metal chalcogenide may have the general formula MEn, where E is S, Se or Te, and it may for example be AsSx, CdS, CdSe, CdTe, $CuInS_2$, SnSx, InzSe or $Bi_2Te_3$. The metal halide may have the general formula $MX_n$, where M is Pb, Bi, Cd, In, Zn, Sn, Cu, Fe, Ga, Li or Sb and X is I, Br or Cl, and it may for example be $PbI_2$ or $BiI_3$. The hybrid halide perovskite may have the general formula $ABX_3$, where A is Cs, $CHSNH_3$ or $NH_2CH=NH_2$, B is Pb or Sn, and X is Cl, Br or I.

The quantum dot loading in the host material may vary between 1% and 90%. The diameter of the semiconductor nanocrystals or quantum dots may, for example, be in the range 2-20 nm. The photosensitive semiconductor materials may provide substantial optical absorption in the wavelength range of 0.4-5 m, defined by the optical bandgap of materials used.

The capping ligands on the above semiconductor materials may comprise organic molecules or inorganic molecules, or a combination of both. Organic ligands may include, but are not limited to, alkyl or aryl thiols, such as 1,2-ethanedithiol, 3-mercaptopropionic acid, benzenethiol, etc. Organic ligands may also include alkyl or aryl amines, N-heterocycles, such as 1,2-ethylenediamine, pyridine, etc. Inorganic ligands may include atomic halogens (I, Br, Cl), pseudo halogens (SCN), or chalcogens (S, Se). Inorganic ligands may also include metal halides or metal chalcogenides.

However, in any of the embodiments presented in this disclosure, the photoactive semiconducting layer may also be a thin-film semiconducting layer with a crystalline or amorphous structure. The thin-film semiconducting layer may comprise a material selected from the group: PbS, PbSe, PbTe, CdS, CdSe, CdTe, ZnS, ZnO, CuS, $Cu_2S$, $Cu_2Se$, CZTS, MnS, $Bi_2S_3$, $Ag_2S$, AgzSe, HgTe, HgCdTe. GaSe, $MoS_2$, CIS, InAs, InSb, Ge, or Si.

Furthermore, the layer of photoactive semiconducting material may also be a multilayered structure which comprises two or more sublayers, where each sublayer may be formed of a different photoactive semiconducting material. The layer of photoactive semiconducting material may in this case comprise a stack where each sublayer comprises one of the semiconductor nanocrystal materials or thin-film semiconducting materials listed above. The electric properties of the materials in each sublayer may be selected so that a Schottky junction, a p-n junction, a p-i-n junction or an nBn junction, or a combination of several such junctions, is formed between two or more sublayers in the stack.

Second Device Embodiment

The photosensitive device may be a voltage-mode device which comprises a single-ended measurement electrode in contact with the ambipolar two-dimensional material. The control unit may be configured to measure the electric potential of the ambipolar two-dimensional material through the measurement electrode. In this embodiment, source and drain electrodes are not used because no current needs to be driven through the ambipolar two-dimensional material.

FIG. 3 illustrates a voltage-mode device which comprises a photoactive semiconducting material 31, a graphene sensing electrode 32, a bottom gate electrode 341 and a top gate electrode 342. A layer of insulating material 33 separates the bottom gate electrode from the graphene sensing electrode 32. A single-ended measurement electrode 38 is used to measure the electric potential of the sensing electrode 32. The gate electrodes define a first region 37. The interface between the photoactive semiconducting material 31 and the graphene channel 32 is again restricted only to the first region 37, even though the graphene sensing electrode 32 may extend outside of the first region 37. The insulating layer 33 is located between the gate electrode 341 and the graphene channel 22. The insulating layer 33 covers the gate electrode 341 in the first region 37, and the graphene channel 32 covers the insulating layer 33.

In this disclosure, the term "single-ended measurement electrode" means an electrode which is configured to transmit the electric potential of the sensing electrode to external measurement circuitry. The term "single-ended" also means that the measurement electrode is not paired with another measurement electrode connected to the same sensing electrode.

Even so, multiple electrodes can still be connected to the sensing electrode for backup purposes, for example. Other electrodes connected to the sensing electrode, such as reset electrodes (not illustrated in FIG. 3), may also sometimes be used as measurement electrodes. But even if more than one measurement electrode is connected to the sensing electrode, they must be configured for a single-ended measurement if they are to be used for determining the potential of the sensing electrode. A single-ended measurement electrode is connected to a readout circuit configured for measuring electric potential They are not paired with other measurement electrodes connected to the same sensing electrode. A single-ended measurement electrode, in the meaning used in this disclosure, does not and cannot set different parts of the sensing electrode to different electric potentials. All portions of the sensing electrode are at the same potential when the measurement is made.

Everything which was stated about the vertical ordering of the gate electrodes, the photoactive semiconducting layer and the ambipolar two-dimensional material in the first device embodiment applies to this device embodiment as well. In other words, either gate electrode 341 or 342, or both of them, may be used to provide a voltage bias across the junction between the photoactive semiconducting material 31 and the graphene sensing electrode 32. If only one gate electrode is used, the other may not be needed. An additional insulating layer may be present between the photoactive material 31 and the top gate electrode 342. And the structure may also be prepared upside down, with the graphene sensing electrode covering the photoactive semiconducting layer, and all other layers placed on the vertically opposite side of the graphene sensing electrode compared to FIG. 3.

Furthermore, all of the possible materials specified for the ambipolar two-dimensional material and the photoactive semiconducting layer in the first device embodiment can also be used in this second device embodiment Operating Principles It has been discovered that an electric shutter can be operated in the photosensitive devices described above if the photoactive semiconducting material and the ambipolar two-dimensional material are configured so that the non-screening gate voltage interval of the ambipolar two-dimensional material is suitably aligned (on a gate voltage axis) with the depletion regime of the junction between the photoactive semiconducting material and the ambipolar two-dimensional material.

In this description of the operating principle, graphene will be used as an example of an ambipolar two-dimensional material, and PbS quantum dots will be used as an example of a photoactive semiconducting material.

As described in the section on theoretical background above, in the absence of an external bias voltage, the junction between the ambipolar two-dimensional material layer and the photoactive semiconducting material has a certain equilibrium built-in voltage. This built-in voltage is determined by the electron work functions of both the photoactive semiconducting material and the graphene.

When the junction is subjected to an external bias, for example a gate voltage applied to a nearby gate electrode, the interface voltage becomes a sum of the built-in voltage and the bias voltage provided by the gate electrode. The bias voltage generated at the junction by a given gate voltage depends on the geometry of the device, the thicknesses and electric/dielectric properties of the layers between the gate electrode and the junction (such as insulating layers 23/33 or photoactive semiconducting layers 21/31 in FIGS. 2 and 3, respectively), and on the degree to which the graphene layer screens the gate voltage. In the devices presented in the two device embodiments above, when the photoactive semiconducting layer and the ambipolar conductive material are suitably configured, the non-screening gate voltage interval of the ambipolar two-dimensional material may include a flat-band gate voltage at which the bias voltage becomes equal, but opposite in sign, to the built-in voltage. The interface voltage becomes zero at this flat-band gate voltage.

As mentioned above, the bias voltage at which an ambipolar material such as graphene is converted from an n-type conductor to a p-type conductor may be called its charge neutrality point, or Dirac point. The gate voltage which corresponds to this bias voltage may be called the charge-neutrality gate voltage or the Dirac gate voltage. At this voltage, the majority carrier type in the graphene layer changes from n-type to p-type or vice versa. This change may also be expressed as a change in the polarity of conductance of the ambipolar material.

The charge neutrality point of an ambipolar two-dimensional material depends on the doping concentration in the material. This concentration can be altered by extrinsic chemical doping. Since it is preferable not to apply very large gate voltages to the photosensitive device, the ambipolar two-dimensional material and the insulation of the gate electrode may for example be configured so that the charge neutrality gate voltage falls for example somewhere in the range −3 V to +3V, or somewhere in the range −2V to +2V, or somewhere in the range −1V to +1V.

It has been discovered that the photoactive semiconducting material and the ambipolar two-dimensional material can be configured so that there is a non-screening gate voltage interval where an interface voltage at the junction between the photoactive semiconducting layer and the ambipolar two-dimensional material can be changed by applying to the gate electrode a gate voltage which falls within the non-screening gate voltage interval. The same materials can be configured so that the non-screening gate voltage interval comprises a flat-band gate voltage at which the interface voltage is zero, a depletion gate voltage range where the interface voltage is nonzero, and a charge-neutrality gate voltage at which the ambipolar two-dimensional material is at its charge-neutrality point. Finally, the same materials can also be configured so that the depletion gate voltage range and the charge-neutrality gate voltage lie on the same side of the flat-band gate voltage on a gate voltage axis.

Alternatively, the gate voltage at which the ambipolar two-dimensional material is at its charge neutrality point may lie between the flat-band gate voltage at which the interface voltage is zero and the threshold gate voltage at which the interface voltage exhibits a local maximum.

The technical meaning of these definitions will be described with reference to FIGS. 4a-4f below, which illustrate schematically the working principle of devices according to the first and second device embodiments. The gate voltage forms the horizontal axis. The gate voltage increases from left to right. An indicator 41 at the top of the figure shows the polarity of the ambipolar two-dimensional material at each gate voltage. An indicator 42 at the bottom of the figure shows the prevailing regime at the junction between the ambipolar two-dimensional material and the photoactive semiconducting layer at each gate voltage. The "depletion gate voltage range" corresponds to the depletion regime, which is marked with the bar "Depletion" in the indicator 42. The charge neutrality point is the point 411, where the majority carrier type of the ambipolar two-dimensional material changes.

Figure 4A:
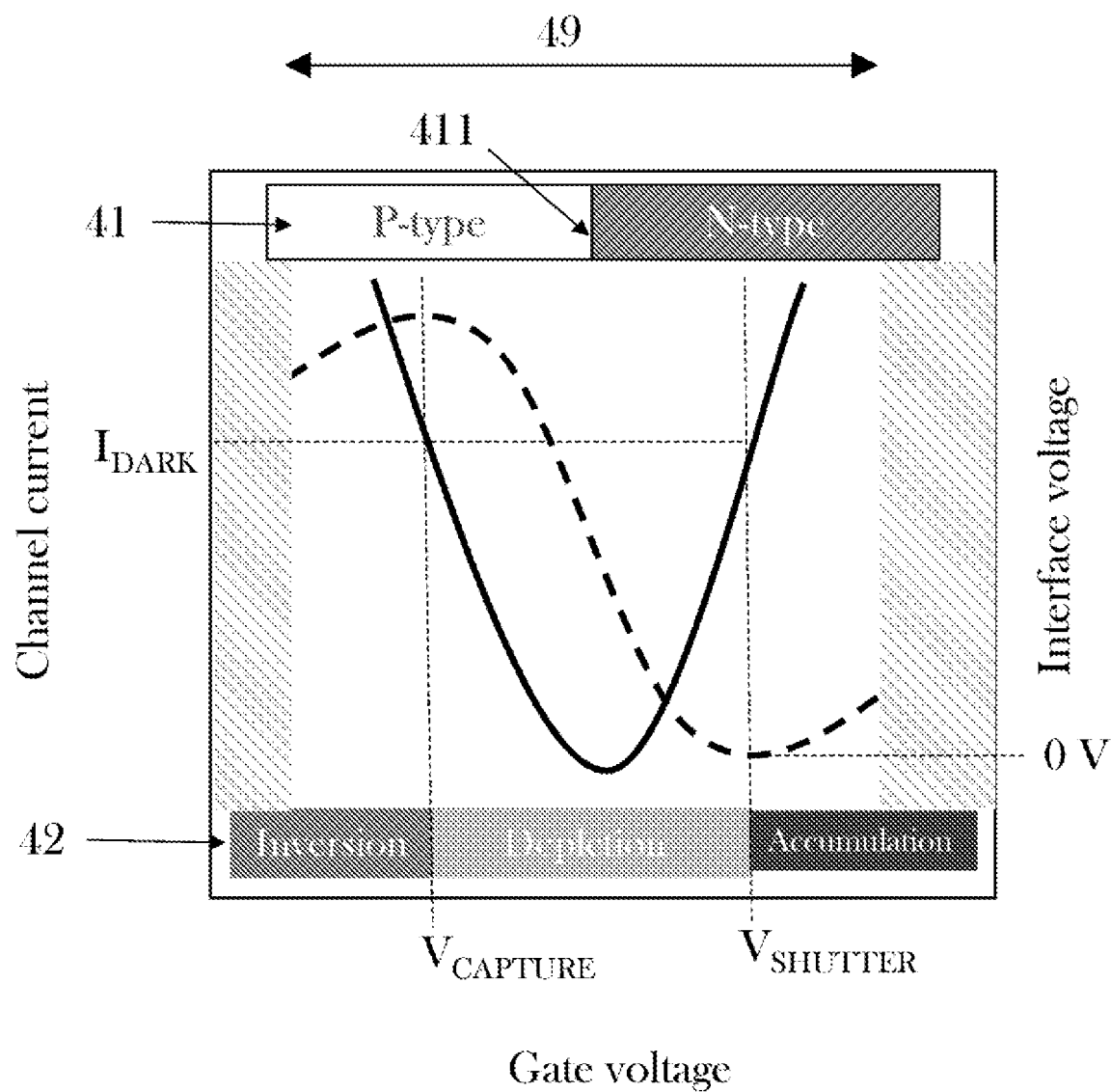
FIGS. 4a-4f illustrate the operating principles of the photosensitive devices.

In FIG. 4a, the solid curve illustrates the conductance curve of graphene. In a transistor, the source-drain current driven through the transistor channel will vary as a function of gate voltage in the manner illustrated by the conductance curve, as long as the source-drain voltage is kept constant. The source-drain voltage can be fixed to any suitable value where radiation-dependent changes in the current can advantageously be detected. The solid curve in FIG. 4a current therefore also illustrates the dark current which a transistor-type photosensitive device outputs as a function of gate voltage when the device is not illuminated. Illuminated current-voltage curves will be presented in the measurement embodiments presented below.

The current has a minimum at the charge neutrality gate voltage which corresponds to point 411 on the gate voltage axis, and then increases when the gate voltage moves away from the charge neutrality point in either direction. In FIG. 4a, gate voltages smaller than the charge neutrality gate voltage induce p-type conduction in the ambipolar two-dimensional material, while gate voltages greater than the charge neutrality gate voltage induce n-type conduction.

The dashed curve in FIG. 4a illustrates the absolute value of the interface voltage at the junction between the ambipolar two-dimensional material and the (n-type) photoactive semiconducting layer as a function of gate voltage. The curve is only schematic, because the interface voltage depends on the electric properties of the semiconducting material and the ambipolar two-dimensional material, as described above. However, the zero point of the interface voltage is known and can be illustrated. It lies at the point where the absolute value of the interface voltage obtains its minimum value at the boundary between the depletion regime and the accumulation regime. A local maximum lies at the boundary between the depletion regime and the inversion regime.

The shaded areas to the left and right of the dashed curve illustrate the boundaries of the non-screening gate voltage interval 49, which is a range of gate voltages where the graphene layer does not screen (or screens only partially) the electric field applied by the gate electrode. Gate voltages which exceed these boundaries have a negligible effect on the interface voltage because they are screened by the graphene layer. Furthermore, as mentioned above in the theoretical section, in the inversion and accumulation regimes, the majority of the gate voltage drops across the gate insulator. Therefore, when the gate voltage crosses the boundaries of the non-screening gate voltage interval, and/or moves into the inversion and accumulation regimes, the combined effect of screening and/or inversion/accumulation brings the interface voltage back to the built-in voltage of the junction.

In order to operate a photodevice with an electric shutter by altering the gate voltage, it should be possible to place the device in two different states by changing the gate voltage within the non-screening gate voltage interval. These states may be called the light-sensitive state and the light-immune state, respectively. In the light-sensitive state, there is an interface voltage which transfers charge carriers released in the photoactive semiconducting layer to the ambipolar two-dimensional material before they have a chance to recombine.

If the photosensitive device is a transistor, then, depending on the charge-carrier type, the source-drain current either decreases or increases when charge carriers released by photons in the photoactive layer move to the transistor channel, and the source-drain current thereby becomes dependent on light-intensity. In the light-immune state, the interface voltage should preferably be zero. The charge carriers released by electromagnetic radiation in the photoactive semiconducting material are in this case not transferred by an electric field into the ambipolar two-dimensional material. Most charge carriers released in the photoactive layer will therefore recombine with charge carriers of the opposite type within the photoactive layer. No multiplication of light-induced charge carriers occurs in the source-drain current in this case. The source-drain current is then nearly independent of light-intensity. The gate voltage at which the source drain-current of the device is measured in the light-immune state may be called the shutter-mode voltage, and it should be as close as possible to the flat-band gate voltage. The gate voltage at which the source-drain current of the device is measured in the light-sensitive state may be called the capture-mode voltage.

The dark source-drain current may be the same at the shutter mode voltage and the capture mode voltage. In other words, when the entire device is shaded, so that no radiation reaches the device, the capture-mode voltage and the shutter-mode voltage may yield the same source-drain current. The capture-mode voltage may be chosen so that the dark current measured at the capture-mode voltage becomes equal, or at least approximately equal, to the dark current measured at the shutter-mode voltage.

The ambipolarity of graphene facilitates the reliable measurement of a photodetector response, because the measurement conducted in the light-immune state can be made when the graphene conductance is n-type, and the measurement conducted in the light-sensitive state can be conducted when the graphene conductance is p-type (or vice versa).

This is illustrated in FIG. 4a. The shutter-mode voltage $V_{SHUTTER}$ may be set as close as possible to the gate voltage where the interface voltage becomes zero. This sets the device in a light-immune state when the shutter-mode voltage is applied to the gate electrode. The shutter-mode voltage may be allowed to deviate slightly from the flat-band gate voltage, so that the interface voltage obtains a small nonzero value at the shutter-mode voltage, if this small nonzero interface voltage only produces an insignificant increase or decrease in current when the device is illuminated.

The capture-mode voltage $V_{CAPTURE}$ may be set to a value where the dark current through the channel reaches the same value (both with the opposite conductivity type) as at $V_{SHUTTER}$. In FIG. 4a, the dark current at both the capture-mode voltage and the shutter-mode voltage is $I_{DARK}$.

The schematic curves illustrated in FIG. 4a illustrate a device where the junction between the ambipolar two-dimensional material and the photoactive semiconducting material turns from the inversion regime to the depletion regime at the same gate voltage $V_{CAPTURE}$ where the capture-mode dark current (p-type conductance) is equal to the shutter-mode dark current (n-type conductance). This is an advantageous arrangement because the electric field at the interface junction is then maximized in the capture mode.

The ambipolar two-dimensional material may have a first conductivity type and a sheet resistance of 1-20 k$\Omega$/□ in a first gate voltage range which includes the shutter voltage $V_{SHUTTER}$. The ambipolar two-dimensional material may have a second conductivity type and a sheet resistance of 1-20 k$\Omega$/☐ in a second gate voltage range which includes the capture voltage $V_{CAPTURE}$. The sheet resistance may be equal at the shutter voltage and the capture voltage, and the ambipolar two-dimensional material may have the same transconductance at the shutter voltage and capture voltage.

Figure 4B:
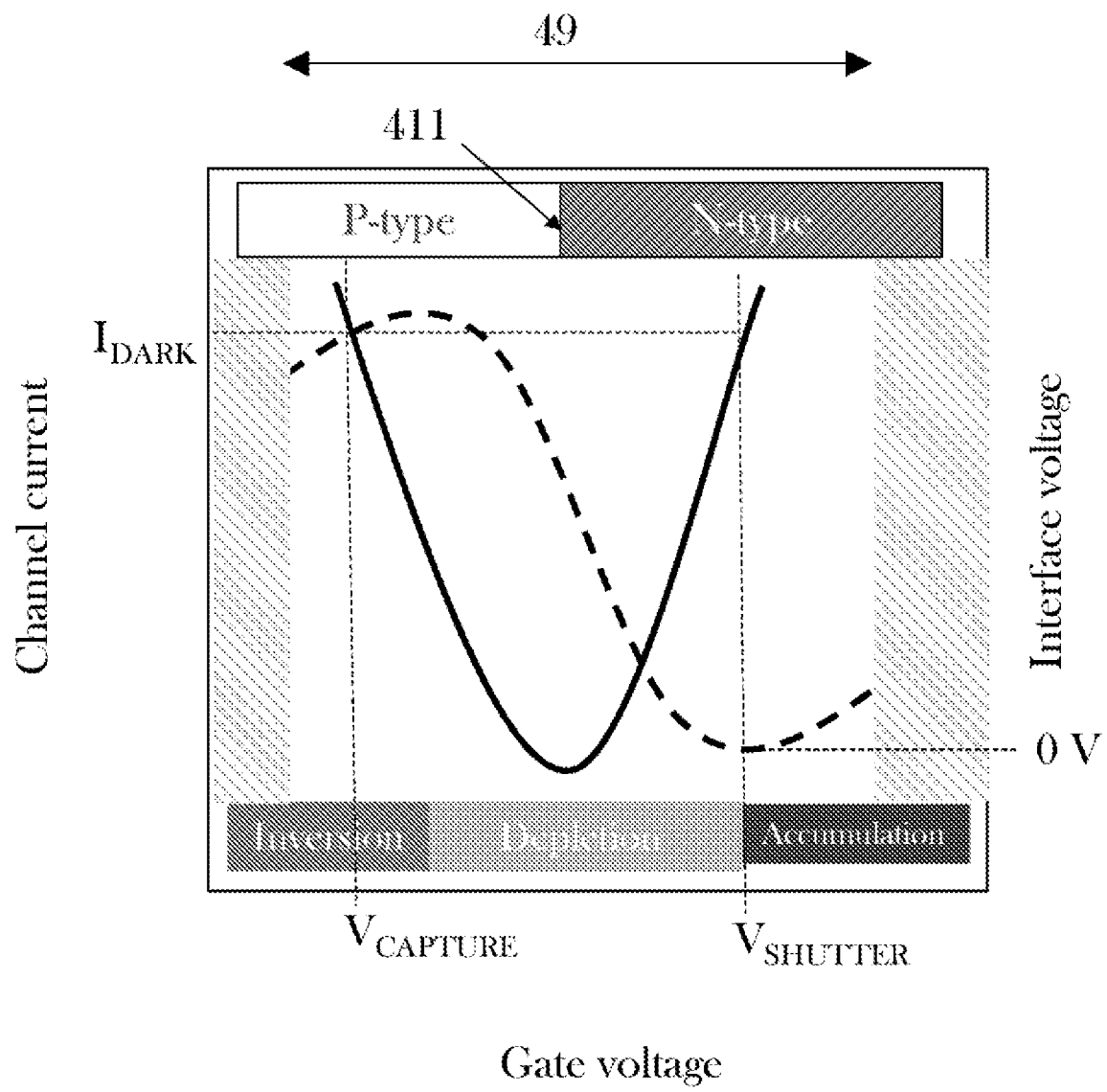
Figure 4C:
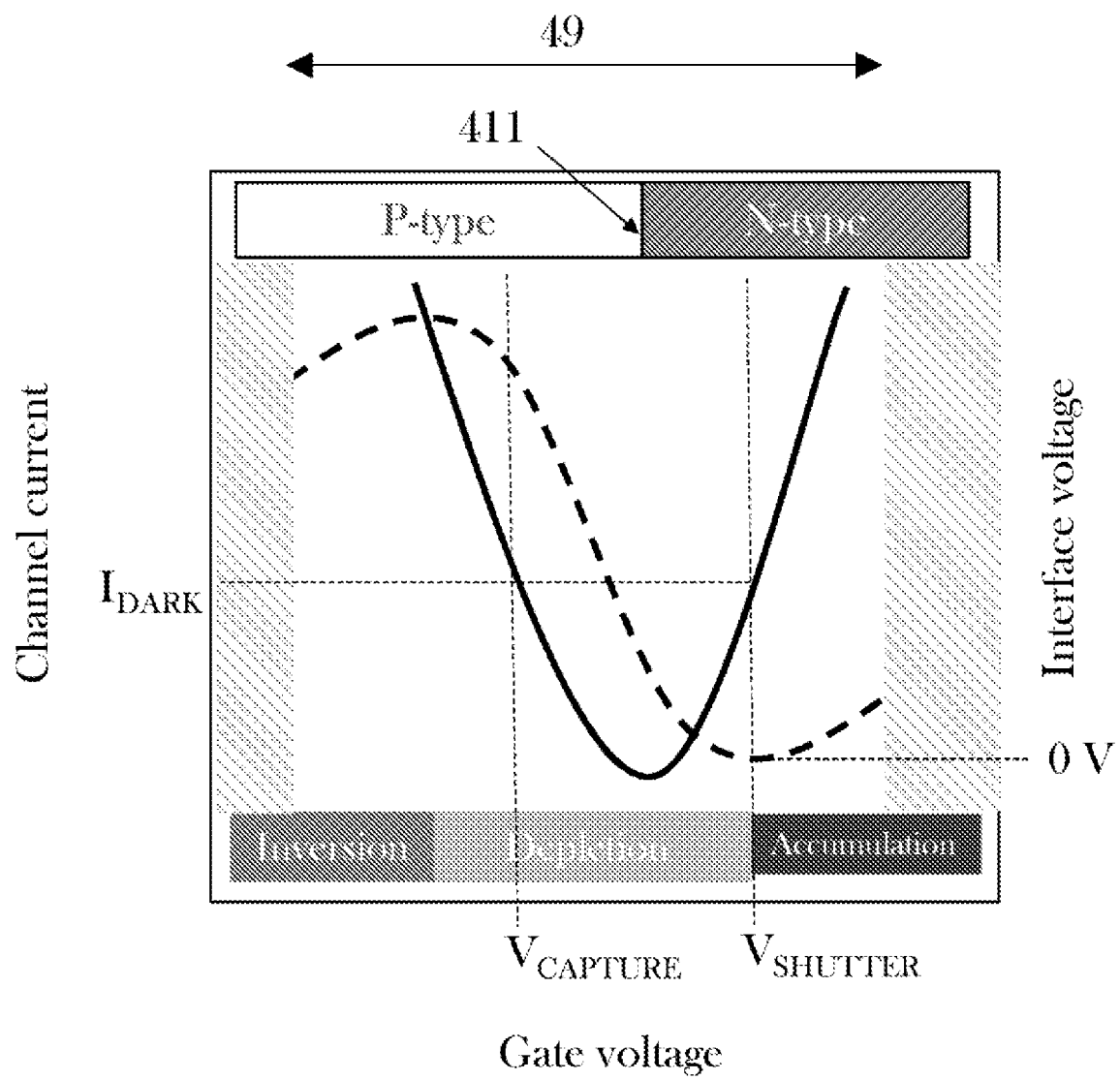

However, it may not always be possible or preferable to align the interface voltage maximum precisely with the capture-mode voltage. FIG. 4b illustrates a dark current curve of the ambipolar material which is shifted to slightly lower gate voltages than in FIG. 4a. The n-type dark conductance at the shutter-mode voltage is larger in FIG. 4b than in FIG. 4a, but the corresponding p-type dark conductance now occurs at a voltage which is slightly lower than the gate voltage at which the interface voltage is maximized. Correspondingly, FIG. 4c illustrates a dark current curve which is shifted to slightly greater gate voltages than in FIG. 4a. In this case, the n-type dark conductance at the shutter-mode voltage is smaller in FIG. 4b than in FIG. 4a, and the corresponding p-type dark conductance now occurs at a voltage which is slightly greater than the gate voltage at which the interface voltage is maximized.

Figure 4D:
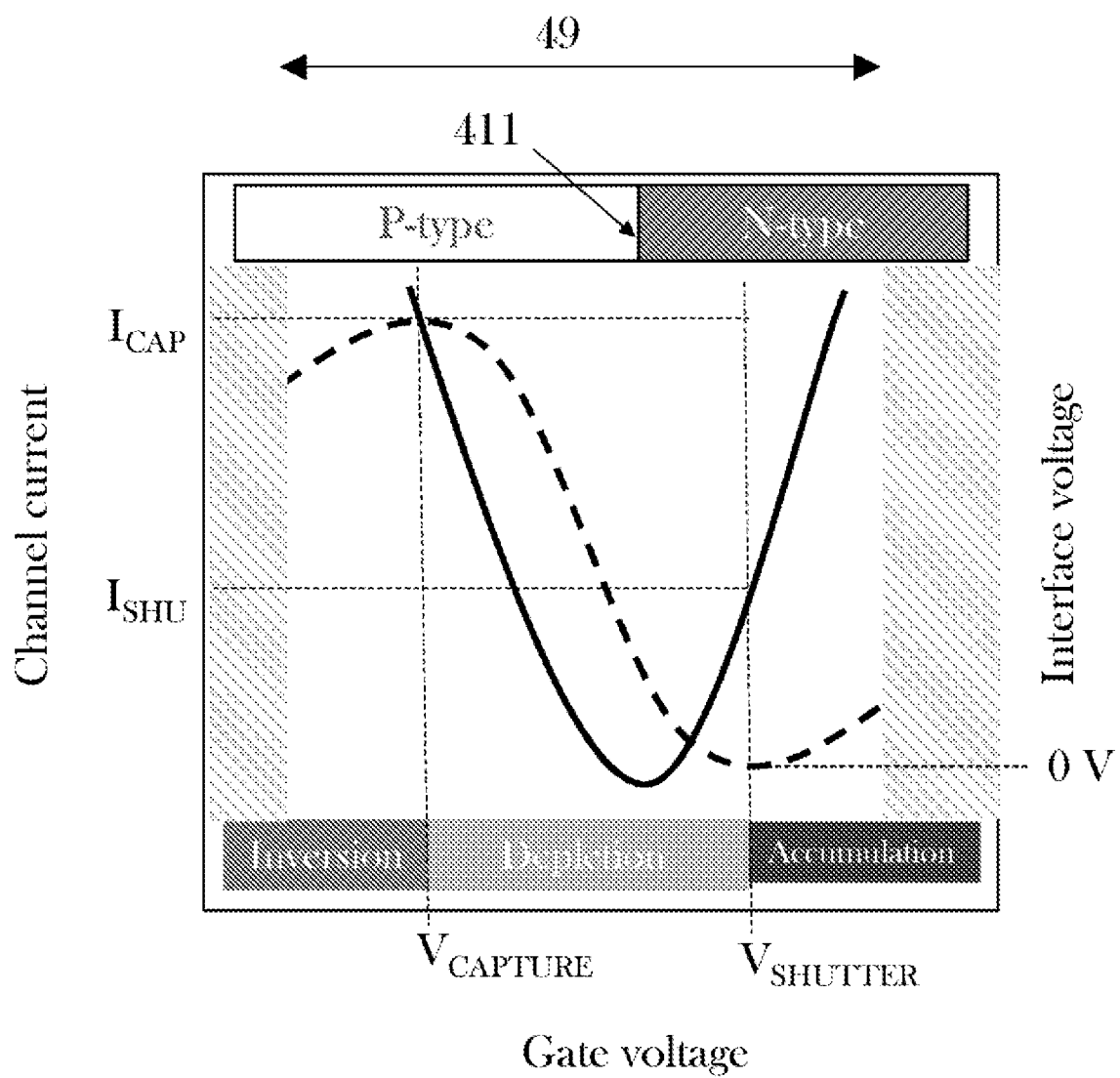

FIG. 4d illustrates the same characteristic curves as FIG. 4c, but a different measurement principle. In this case the capture-mode voltage is not set to a value where the capture-mode dark current, $I_{CAP}$, equals the dark current obtained at the shutter-mode voltage, $I_{SHU}$. Instead, the capture-mode voltage is set to a different value, for example to the threshold voltage where the interface voltage is maximized. Even if the dark currents $I_{CAP}$ and $I_{SHU}$ are in this case different, a dark current value measured at the shutter-mode voltage can nevertheless be used as a reference value against a current value measured in the light-sensitive state can be compared. Calibration experiments may be performed to determine the difference between $I_{CAP}$ and $I_{SHU}$, and the dark current measured at the shutter-mode voltage can be used to eliminate the effect of noise on a current measurement even if the dark current values $I_{CAP}$ and $I_{SHU}$ are not of equal magnitude.

The shutter mode and the capture mode can be operated advantageously when the dark current curve of the ambipolar material curve is configured to coincide with interface voltage curve in such a manner that the charge neutrality point lies between the flat-band gate voltage at which the interface voltage is zero and the threshold gate voltage at which the interface voltage exhibits a local maximum. In FIGS. 4a and 4d, $V_{CAPTURE}$ equals the threshold voltage, and $V_{SHUTTER}$ equals the threshold voltage. However, as seen in FIGS. 4b and 4c, $V_{CAPTURE}$ can be freely shifted to other gate voltage values as well. $V_{SHUTTER}$ may also be shifted away from the flat-band gate voltage, but it is typically advantageous to set it as close as possible to the flat-band gate voltage.

The shutter mode and the capture mode cannot be efficiently operated if the dark conductance curve of the ambipolar material is shifted so far to the right that the charge neutrality gate voltage would exceed the shutter-mode voltage in FIGS. 4a-4d. The current in the light-sensitive state and the light-immune state would in this case have to be measured at the same polarity (p-type polarity in FIGS. 4a-4d). Since the dark currents could not be the same at the capture voltage and shutter voltage, these voltages would have to lie quite close to each other, and at relatively low values of interface voltage, if they are to fit within the non-screening gate voltage interval.

In other words, the non-screening gate voltage interval should comprise a flat-band gate voltage at which the interface voltage is zero, a depletion gate voltage range where the interface voltage is nonzero, and a charge-neutrality gate voltage at which the ambipolar two-dimensional material is at its charge-neutrality point. The depletion gate voltage range and the charge-neutrality gate voltage should lie on the same side of the flat-band gate voltage on the gate voltage axis, for example on the left side of the flat-band gate voltage in FIGS. 4a-4d. The light-immune state and the light-sensitive state can then be clearly separated from each other on the gate voltage axis.

As seen in FIGS. 4a-4d, any voltage between the flat-band gate voltage and the threshold gate voltage (where the interface voltage exhibits a local maximum) lies in the depletion gate voltage range. The shutter function can, for example, be operated when the charge neutrality point lies between the flat-band gate voltage at which the interface voltage is zero and any gate voltage in the depletion gate voltage range, as long as the charge-neutrality gate voltage lies in the non-screening gate voltage interval, on the same side of the flat-band gate voltage as the depletion regime.

In FIGS. 4a-4d, the "same side" of the flat-band gate voltage is the left-hand side of the line defined by the shutter voltage $V_{SHUTTER}$. However, if the doping type in the photoactive semiconducting material would be reversed, the different regimes of the junction would be ordered from left to right as a function of increasing gate voltage in the order, accumulation, depletion, inversion, and the "same side" would in that case be the right-hand side of the flat-band gate voltage (this alternative has not been separately illustrated). In other words, depending on the doping type of the photoactive semiconducting material, the depletion regime and the charge-neutrality point may lie either in the direction of increasing gate voltage or in the direction of decreasing gate voltage in relation to the flat-band gate voltage.

Figure 4E:
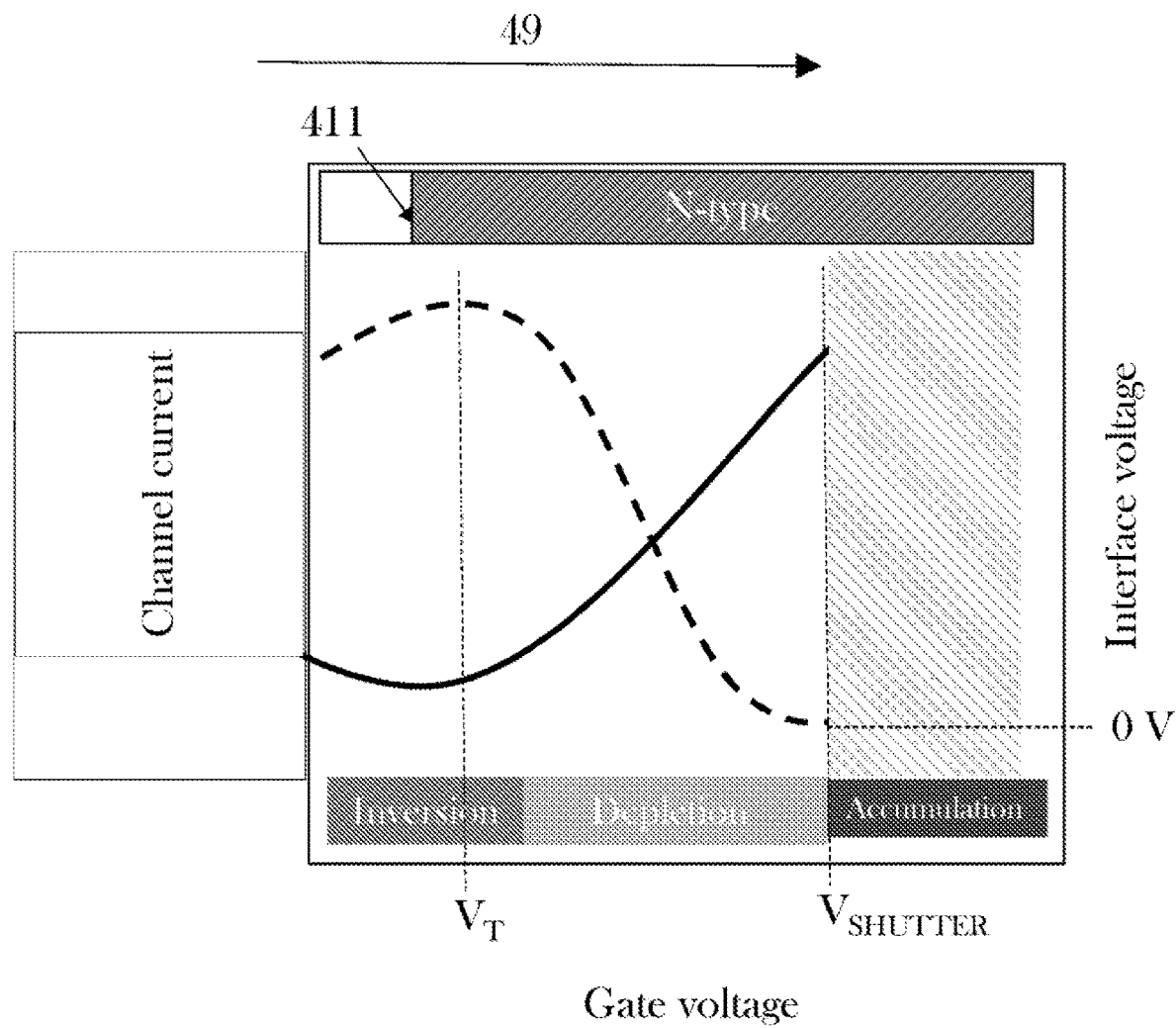

In some cases, the ambipolar two-dimensional material and the photoactive semiconducting layer can also be configured so that the shutter mode and the capture mode can be operated even when the dark current curve of the ambipolar material curve lies so far to the left that the charge neutrality point is obtained at a gate voltage which is further away from the flat-band gate voltage than the threshold gate voltage. This situation is illustrated in FIG. 4e, where the conductance curve has been rescaled. However, if the charge neutrality point is shifted to gate voltages which lie sufficiently far from the flat-band gate voltage, the boundary of the non-screening gate voltage interval 49 will eventually coincide with the flat-band gate voltage, where the light-immune measurement should preferably be conducted at $V_{SHUTTER}$. This is the leftward limit for the location of the charge-neutrality point, because if the conductance curve of the two-dimensional material would lie even further to the left in FIG. 4e, then the ambipolar two-dimensional material would screen the electric field applied by the gate electrode so strongly that there would not exist a gate voltage at which the junction could be brought to a flat-band state. In other words, if the non-screening gate voltage interval does not comprise a flat-band gate voltage at which the interface voltage is zero, then there is always a nonzero interface voltage at the junction, and the electrical shutter cannot be effectively operated.

In practice, the non-screening gate voltage interval cannot be shifted independently of the flat-band gate voltage. Instead, as the charge-neutrality point is shifted further and further to the left in FIG. 4e, the ambipolar two-dimensional material gradually screens more and more of the applied gate voltage. The flat-band gate voltage consequently must be increased to overcome this increased screening, but at some point the screening becomes so strong that increasing the gate voltage only increases screening, so no flat-band voltage can be found. This is the limit which has been schematically illustrated in FIG. 4e.

The operating principles are analogous if the photosensitive device is a voltage-mode device. When electromagnetic radiation is absorbed in the photoactive semiconducting layer, a portion of the electron-hole pairs released by the radiation are separated by the internal electric field at the junction between the ambipolar two-dimensional material and the photoactive semiconducting layer. The released charge carriers which remain in the photoactive semiconducting layer are trapped in this layer. The concentration of these trapped charge carriers will typically be proportional to the intensity of incident electromagnetic radiation, at least under low illumination intensities.

The charge carriers of the opposite type, which are released by radiation and then transferred across the junction, change the charge density of the ambipolar two-dimensional material. It is a unique property of two-dimensional layered materials that the additional charge transferred across the interface changes the charge density per unit area of the two-dimensional material to an extent which can be measured.

This change in charge density alters the electric potential of the sensing electrode (i.e. the ambipolar two-dimensional material) by the amount $\Delta V_G$, which can be expressed as $$\Delta V_G = \left(\frac{\partial V_G}{\partial n_G}\right)\Delta n_G = \frac{e}{C_{ox}}\Delta n_G \approx \frac{e}{C_{ox}}\Delta n_{trapped}$$

where e is the unit charge, $C_{ox}$ is the capacitance between the ambipolar two-dimensional material and the gate electrode, $\Delta n_G$ is change in charge carrier density in the two-dimensional material, and $\Delta n_{capped}$ is the density of charge carriers trapped in the photoactive layer.

The sensing electrode potential thereby becomes dependent on light-intensity. In the light-immune state, the interface voltage should again preferably be zero. No light-induced change in sensing electrode potential takes place in this case, so the potential will be nearly independent of light-intensity. The gate voltage at which the sensing electrode potential of the device is measured in the light-immune state may again be called the shutter-mode voltage, and it should preferably be as close as possible to the flat-band gate voltage. The gate voltage at which the sensing electrode potential of the device is measured in the light-sensitive state may be called the capture-mode voltage.

As in the transistor example, the shutter mode and the capture mode of a voltage-mode device can be operated advantageously when the conduction curve of the ambipolar material curve is configured to coincide with the interface voltage curve in such a manner that the charge neutrality point lies, for example, between the flat-band gate voltage at which the Interface voltage is zero and the threshold gate voltage at which the interface voltage exhibits a local maximum, or at least on the same side of the flat-band gate voltage as the depletion gate voltage range. This is because the light-induced change in carrier density $\Delta n_G$ is, near the charge neutrality point (and under a sufficiently strong illumination intensity), non-negligible in comparison to gate-voltage-induced increases in carrier density.

Figure 4F:
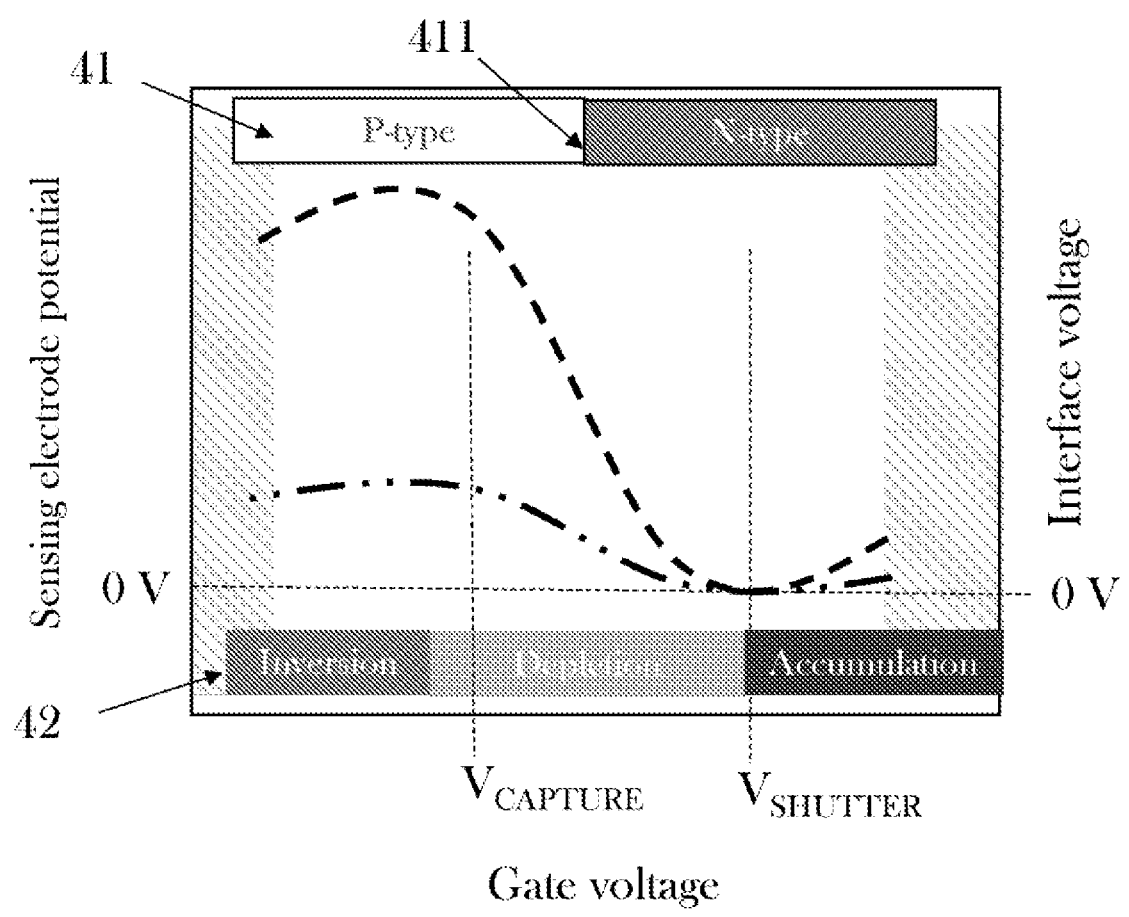

This is illustrated in FIG. 4f, where the dashed line again illustrates the interface voltage, and the dash-dotted line now illustrates the sensing electrode potential. The sensing electrode potential is proportional to the interface voltage and becomes zero at the flat-band gate voltage. As long as the charge neutrality point lies within the non-screening gate voltage interval, on the same side of the flat-band gate voltage as the depletion regime, the sensing electrode potential will be dependent upon the interface voltage and the electric shutter function can be operated.

First Measurement Embodiment

When a transistor structure is utilized in the photosensitive device, the control unit may be configured to measure the source-drain current between the at least one source electrode and the at least one drain electrode as the electrical response of the photosensitive device. The control unit may first set the source-drain current through the ambipolar two-dimensional material to an initial value, and the influence of injected charge carriers released by radiation in the photoactive semiconducting layer can then be detected as a deviation in the source-drain current from this initial value. A nearly simultaneous measurement of the dark current when the device is in the light-immune state provides a reference point for the measured photoinduced current, so that measurement noise is reduced in the calculated response. The response can then be used to calculate the intensity of the radiation incident on the photosensitive device after calibration experiments have been performed.

Figure 5A:
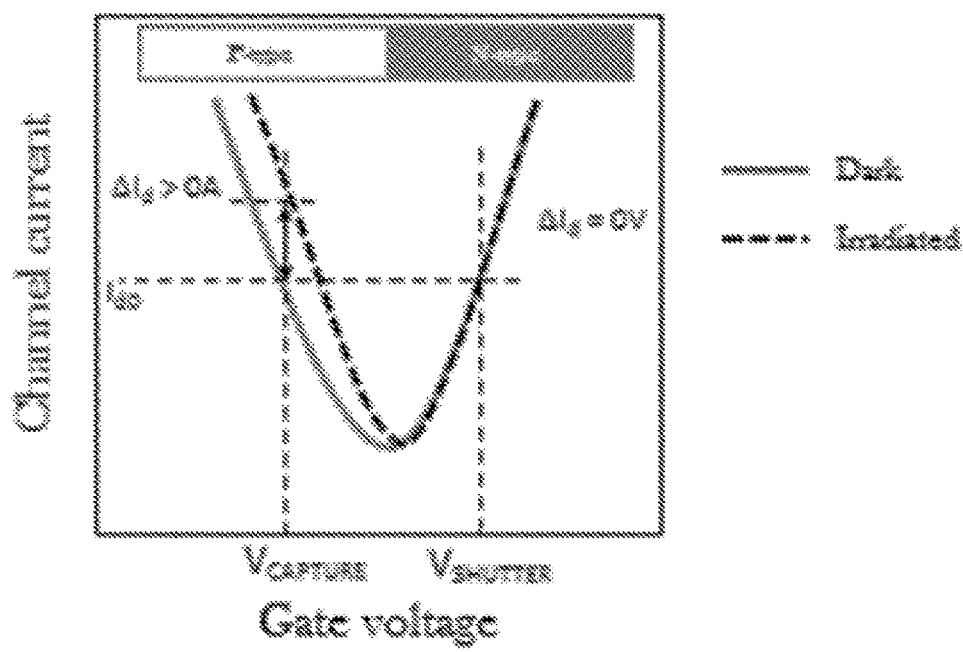
FIGS. 5a-5b illustrate a first measurement embodiment.

FIG. 5a illustrate this measurement graphically. It shows a graphene conductance curve as a function of gate voltage (and as long as the source-drain voltage is assumed to be constant, the curve also illustrates the dependence of the source-drain current on gate voltage). The interface voltage curve illustrated in FIGS. 4a-4e has been omitted for reasons of clarity, but the conductance curve is assumed to be aligned with the interface voltage curve in the manner specified above, so that the device can be set to a light-immune state at a shutter voltage $V_{SHUTTER}$, and to a light-sensitive state at a capture voltage $V_{CAPTURE}$. The solid curve illustrates the conductance curve if the entire device is in the dark, and the dashed curve indicates the conductance curve if the entire device is illuminated. The solid and dashed curves overlap in the light-immune state around the shutter voltage, but they diverge from each other in the light-sensitive state on the left-hand side. The dark currents are in this case assumed to be equal at the shutter voltage and the capture voltage. The current difference $\Delta I_d$ between the dark and the irradiated curves at the capture voltage $V_{CAPTURE}$ represents the electrical response of the photosensitive device to the incident radiation.

Figure 5B:
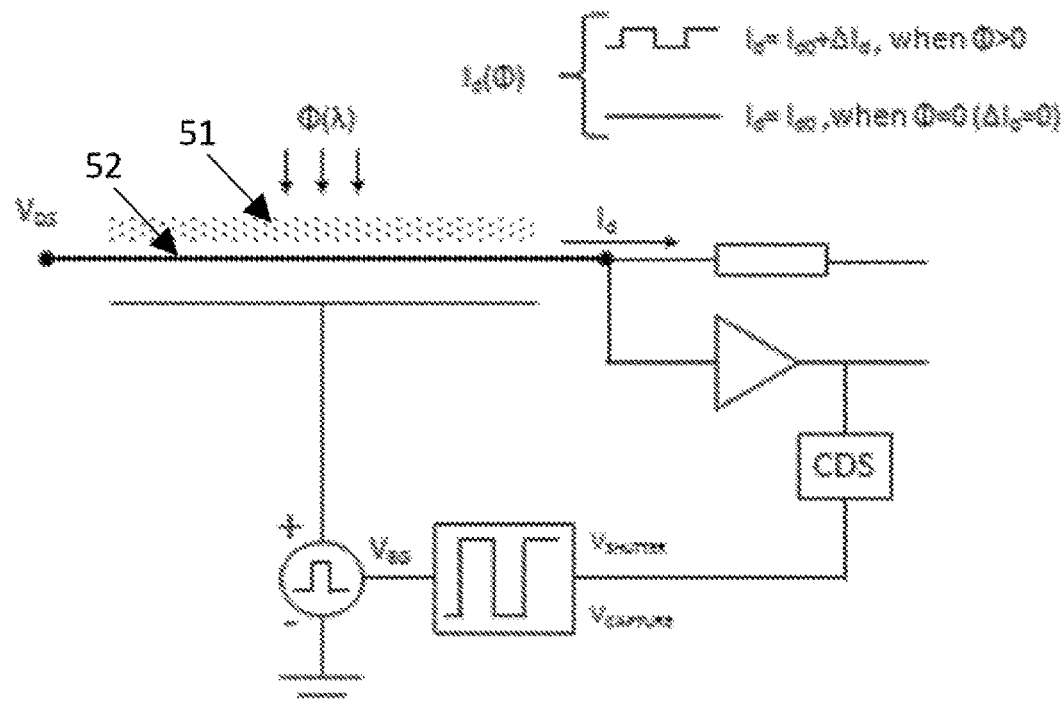

FIG. 5b illustrates an exemplary measurement circuit for performing this photoconductance measurement. The layer 51 represents the photoactive semiconducting layer, and 52 represents the ambipolar two-dimensional material which forms the channel transistor. $V_{DS}$ is the source-drain voltage and $V_{BG}$ is the gate voltage. The control unit can be configured to sequentially bias the device between gate voltage values $V_{CAPTURE}$ and $V_{SHUTTER}$, and to employ a correlated double sampling measurement scheme to deduct the offset drain current. Similarly, fluctuations due to noise or drifting may be deducted. The change in drain current, $\Delta I_d$, is ideally directly proportional to irradiance, $\Phi$.

Second Measurement Embodiment

Another option for measuring a response from a transistor device structure is that the control unit is configured to maintain the source-drain current fixed at a constant source-drain measurement current by adjusting the gate voltage applied to the gate electrode, and to measure the applied gate voltage as the electrical response of the photosensitive device. In other words, in this embodiment the influence of injected charge carriers released by radiation in the photoactive semiconducting layer is not detected as a deviation in the source-drain current from an initial value, but as a deviation in the gate voltage which must be applied to the gate electrode to maintain the source-drain current at a fixed value. The chosen fixation value of the source-drain measurement, which is determined by the source-drain voltage and by the shutter voltage, may be any current value which suits the measurement arrangement.

Figure 6A:
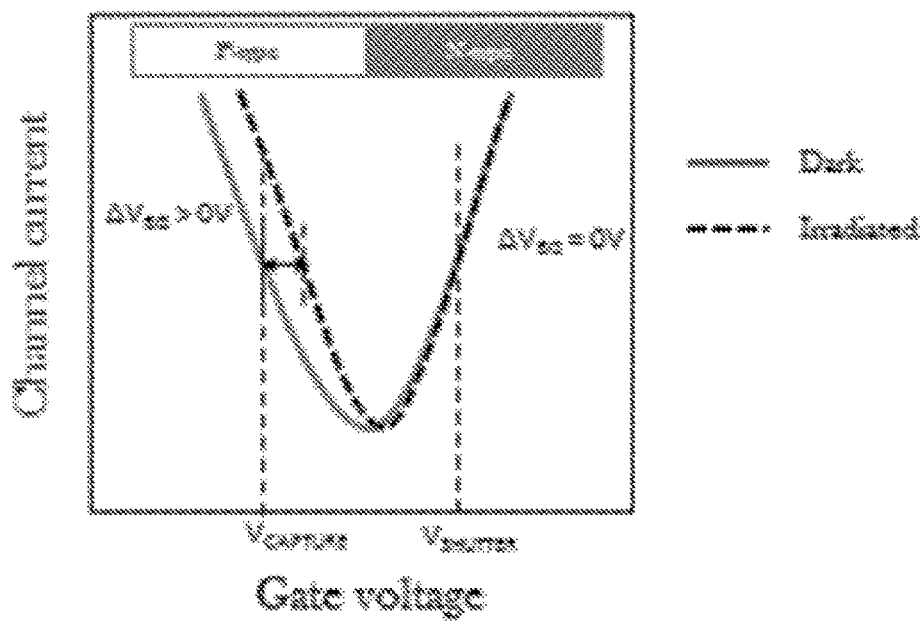
FIGS. 6a-6b illustrate a second measurement embodiment.

FIG. 6a illustrate this measurement graphically. It shows a graphene conductance curve as a function of gate voltage. The solid curve illustrates the conductance curve if the entire device is in the dark, and the dashed curve indicates the conductance curve if the entire device is illuminated. The shift in the conductance curve is the same as in FIG. 5a, and the device can be set to a light-immune state at a shutter voltage $V_{SHUTTER}$ as in the previous embodiment. The source drain current at the shutter voltage may be designated $I_{d0}$.

In the capture mode the gate electrode may first set to an Initial capture voltage $V_{CAPTURE}$ which is known to be approximately right, and this the initial capture voltage may be adjusted with relatively small additional increments or decrements $\Delta V_{BG}$ until the source-drain current obtains the value $I_{d0}$ which it had at the shutter voltage. The increment or decrement $\Delta V_{BG}$ represents the electrical response of the photosensitive device to the incident radiation.

Figure 6B:
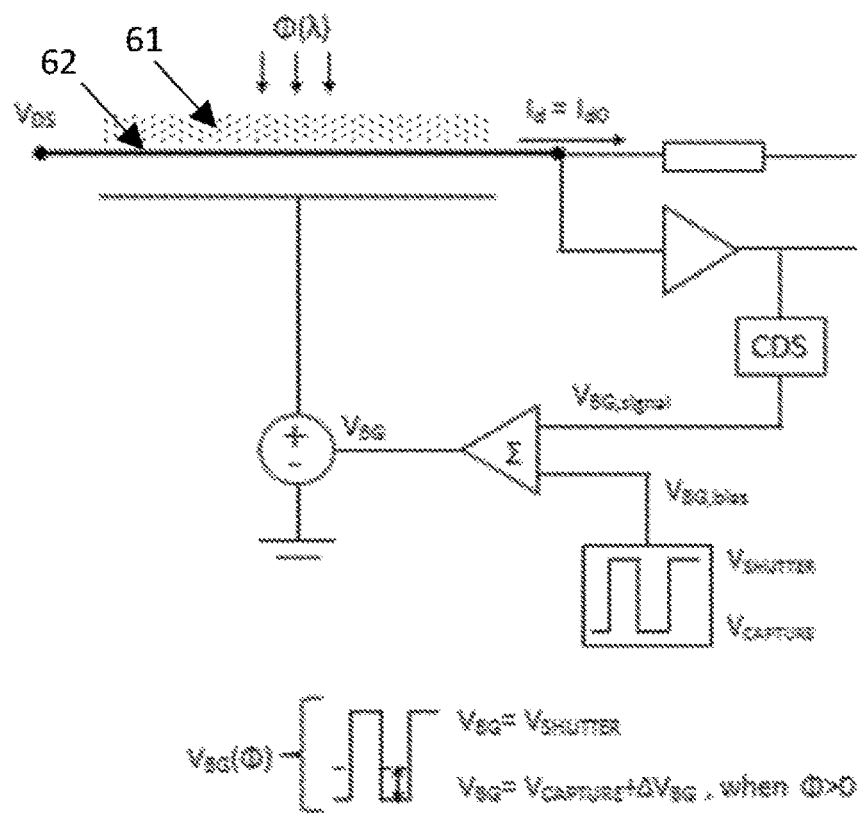

FIG. 6b, where 61 is the photoactive semiconducting layer and 62 is the ambipolar two-dimensional sensing electrode, illustrates an exemplary measurement circuit for performing this photoconductance measurement with back-gate feedback. The gate voltage $V_{BG}$ is implemented as a combination of bias signal $V_{BG\_bias}$, which the control unit may be configured to toggle between the shutter voltage $V_{SHUTTER}$ and the approximately right capture voltage $V_{CAPTURE}$ and a small-signal $V_{BG\_signal}$ which provides the increment or decrement $\Delta V_{BG}$ needed for shifting the capture point to the exact capture point where the photo-induced gate current reaches the desired value $I_{d0}$. The feedback signal, $V_{BG\_signal}$, will ideally be zero at the shutter mode and obtain a non-zero value at the capture point. Correlating the measured $V_{BG\_signal}$ values at both bias values allows deduction of noise and drift via the CDS approach.

Third Measurement Embodiment

If the photosensitive device is a voltage mode device, the control unit may be configured to measure the electric potential of the ambipolar two-dimensional material as the electrical response of the photosensitive device. Furthermore, even when the device structure is a transistor, the electric potential of the ambipolar two-dimensional material can be measured as the electrical response of the photosensitive device if the source-drain electrodes are allowed to float during each measurement cycle.

In this photovoltage measurement, a reset switch may be applied to force the electrical potential of the sensing electrode (which is formed by a layer of ambipolar two-dimensional material, for example graphene) to a given voltage, for example to signal ground, between each capture sequence. During capture, the sensing electrode is allowed to float electrically. The output voltage of the sensing electrode, $V_G$, can be calibrated as a function of light intensity and wavelength.

Figure 7A:
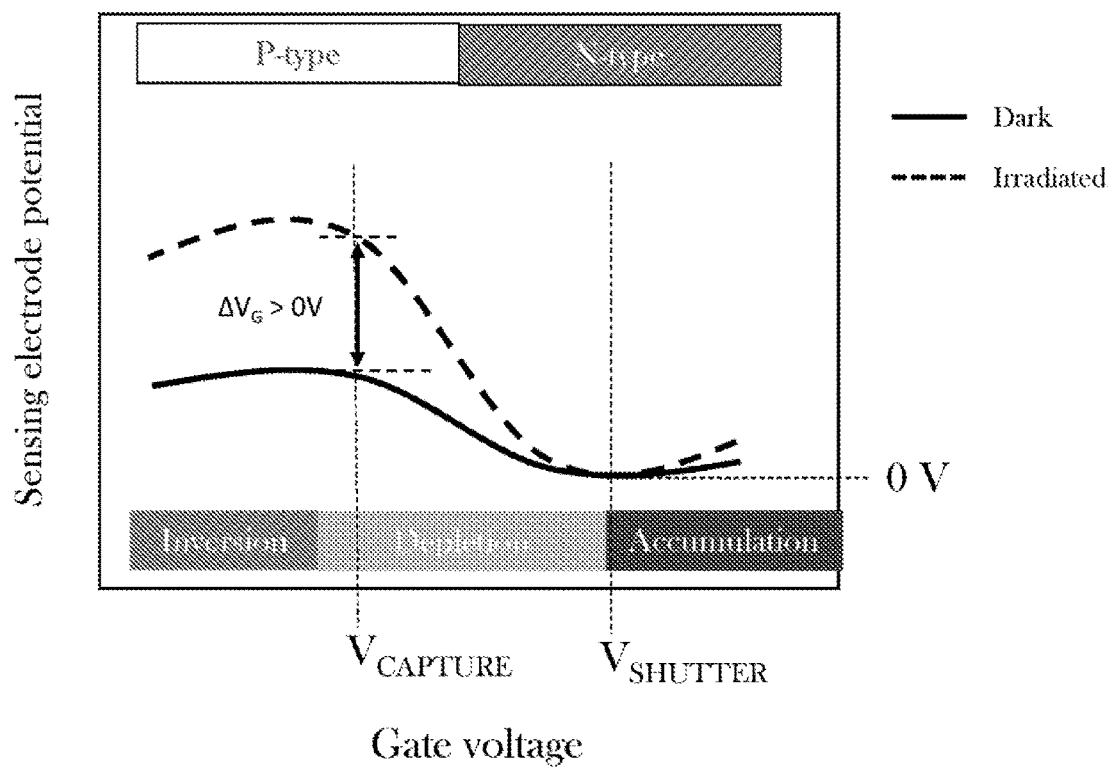
FIGS. 7a-7c illustrate a third measurement embodiment.

FIG. 7a illustrates this measurement graphically. It shows the sensing electrode potential as a function of gate voltage. The solid curve illustrates the sensing electrode potential curve if the entire device is in the dark, and the dashed curve indicates the sensing electrode potential curve if the entire device is illuminated. The interface may alternatively be configured in such a way that upon irradiation the sensing electrode potential is reduced relative to the sensing electrode potential in the dark. The relative change in sensing electrode potential due to illumination is directly proportional to the light-induced change in the interface. The device can be set to a light-immune state at a shutter voltage $V_{SHUTTER}$ as in the previous embodiments.

When the sensing electrode is biased by the gate electrode to the shutter voltage $V_{SHUTTER}$ and the reset switch is opened, the read-out value (which may be called a "shutter frame"). $V_G$, will be independent of irradiance and close to zero. When the sensing electrode is biased to the capture voltage $V_{CAPTURE}$ and the reset switch is opened, the read-out value (which may be called a "capture frame"), $V_G$, will depend on irradiance. By deducting the "shutter frame" from the "capture frame", correlated double sampling allows reduction of noise and other non-idealities.

Figure 7B:
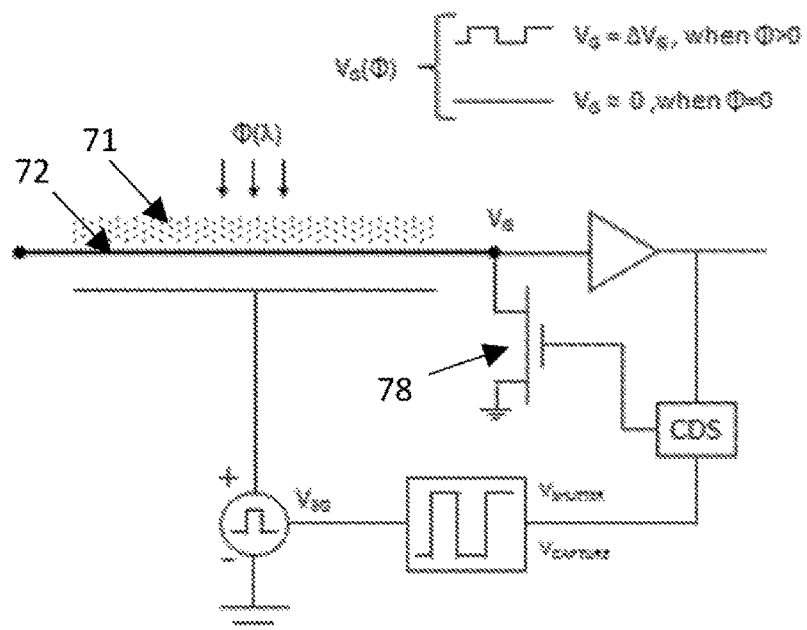
Figure 7C:
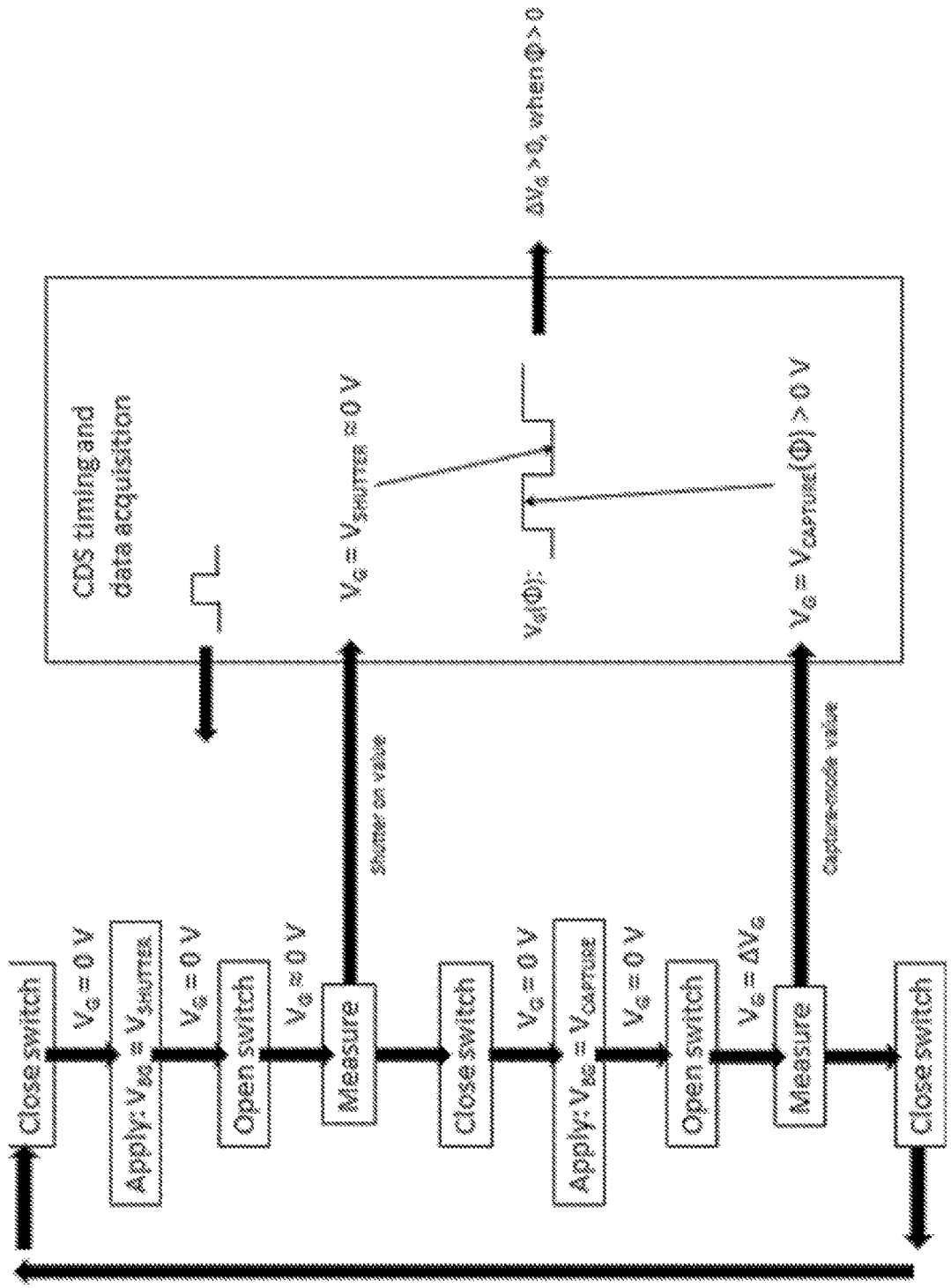

FIG. 7b, where 71 is the photoactive semiconducting layer, 72 is the ambipolar two-dimensional sensing electrode, and 78 is the reset switch, illustrates an exemplary measurement circuit for performing this photovoltage measurement. FIG. 7c illustrates one measurement sequence where the reset switched is closed, the gate voltage is set to the shutter voltage, and the reset switched is then opened before the potential $V_G$ of the sensing electrode is measured as the electrical response of the photosensitive device in the light-immune state. The switch is then closed, the gate voltage is set to the capture voltage, the switch is opened, and the potential $V_G$ of the sensing electrode is measured as the electrical response of the photosensitive device in the light-sensitive state. The control unit may be configured to perform these actions.

EXPERIMENTAL SECTION

The requirements which must be met to achieve the shutter- and capture mode functionality described in this disclosure are complex. The charge neutrality point of an ambipolar two-dimensional material should be suitably aligned with the inversion, depletion and accumulation regimes of the junction between that same material and a suitable photoactive semiconducting layer which can be configured to transfer charge carriers to the ambipolar two-dimensional material under illumination. Furthermore, the energy band levels of the photoactive semiconducting material should be aligned with the energy level of the ambipolar two-dimensional material so that there is no large energy barrier opposing charge carrier injection through the interface.

The doping concentration in an ambipolar two-dimensional material, such as graphene, determines the position of the charge neutrality point and the conductance curve as a function of gate voltage. The electrical properties of the junction depend on the work function potentials of both the ambipolar two-dimensional material and the photoactive semiconducting material. The doping level of the photoactive semiconducting material also influences the depletion width, as explained in the theoretical section above. The work function of the metal in the gate electrode also needs to be optimized to be in line with the properties of the ambipolar two-dimensional material and the photoactive semiconducting material. These parameters can be experimentally balanced against each other, and the ambipolar two-dimensional material and the photoactive semiconducting material can thereby be configured in such a way that the electric shutter function can be operated in the photosensitive device.

Figure 8:
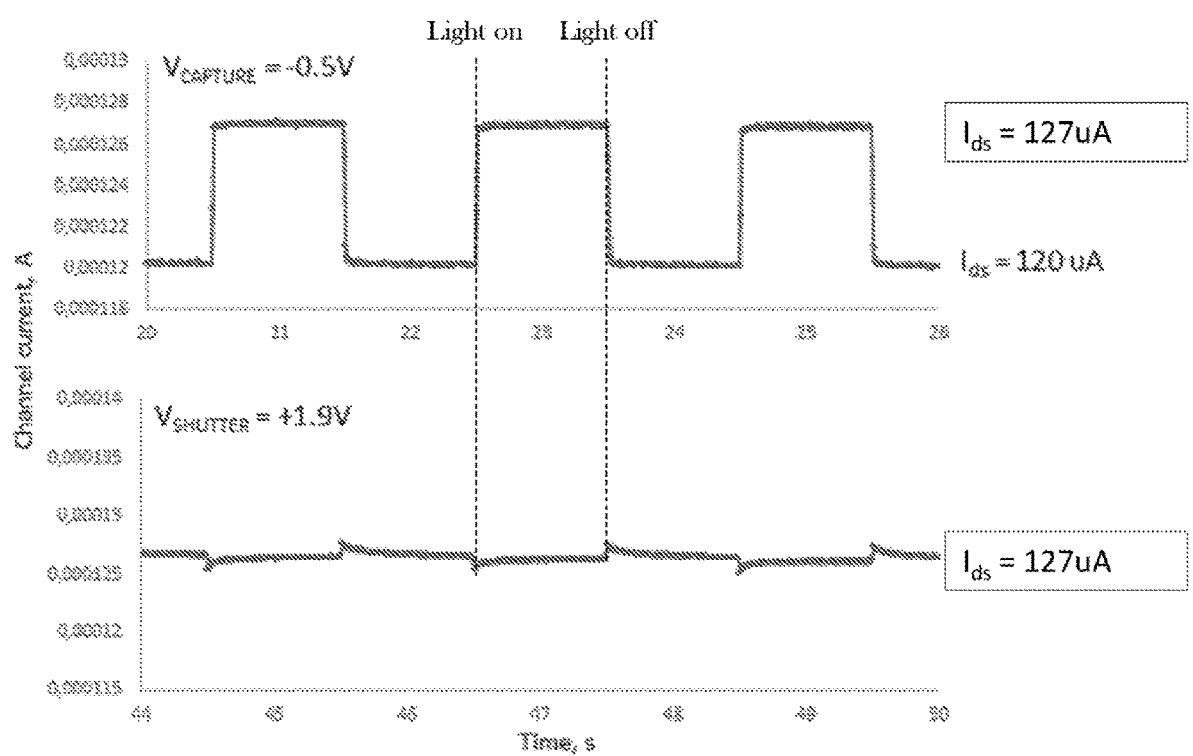
FIG. 8 shows experimental measurements which illustrate the shutter functionality.

FIG. 8 illustrates the photoresponse of a transistor-type photodetector where the photoactive semiconducting material comprises PbS quantum dots and the ambipolar two-dimensional material is graphene, deposited on a relatively high-k dielectric $Al_2O_3$. The capture-mode gate voltage $V_{CAPTURE}$ was in this case −0.5V, while the shutter voltage $V_{SHUTTER}$ was +1.9V. The dark source-drain current was in the same range of 120-127 µA at both the capture voltage and the shutter voltage (the source-drain voltage was 0.5V in both modes). The light, which comprised radiation at 1550 nm wavelength with an intensity of 1 W/m², was pulsed at a frequency of 0.5 Hz. The upper part of the figure illustrates the device response in the light-sensitive state, at the gate voltage $V_{CAPTURE}$. The source-drain current increased by about 7 µA (~6%) each time the light turned on. This is the photoresponse of the photosensitive device. At the shutter voltage $V_{SHUTTER}$, illustrated in the lower part of the figure, the device was in the light-immune state. In this state, each change in illumination intensity produced only a small blip in the source-drain current (<0.5%), after which the current returned to its dark value. The illumination state of the photosensitive device did thereby not influence the photoresponse at all in the light-immune state, so the shutter function worked.

The charge carrier concentration and work function of PbS quantum dots are key parameters which predetermine the electrical behavior of the device, and different engineering solutions can be employed to configure them suitably. For example, the thickness of a PbS quantum dot layer (which may also be a multilayered structure) can greatly influence the electrical properties of the graphene/PbS junction. The flat-band gate voltage can shift several volts if the thickness of the PbS layer is doubled.

Furthermore, the selection of different capping ligands to the PbS layer can have an equally large influence on the properties of the junction. Similar factors can influence the properties of other photoactive semiconducting materials as well. Therefore, each combination of ambipolar two-dimensional material, photoactive semiconducting material, gate insulator material, gate electrode material, and each device design and geometry, requires experimental testing for determining how the materials can be configured to create the electrical shutter functionality described in this disclosure.

The invention claimed is:

1. A photosensitive device which can be configured to provide an electrical response when illuminated by electromagnetic radiation incident on the device, comprising:
    at least one substantially horizontal, electrically conducting gate electrode which defines a first region on a substrate surface, and is configured to receive a gate voltage,
    a substantially horizontal layer of ambipolar two-dimensional material which overlies or underlies the at least one gate electrode across the first region,
    an insulating layer between the at least one gate electrode and the layer of ambipolar two-dimensional material across the first region, and
    a substantially horizontal layer of photoactive semiconducting material which is in contact with and forms a junction with the layer of ambipolar two-dimensional material across the first region,
    wherein the electrical response of the photosensitive device is measured from the ambipolar two-dimensional material,
    wherein the doping concentration of the ambipolar two-dimensional material and the doping concentration of the photoactive semiconducting layer generate a non-screening gate voltage interval where an interface voltage at the junction between the photoactive semiconducting layer and the ambipolar two-dimensional material can be changed by applying to the gate electrode a gate voltage which falls within the non-screening gate voltage interval, and
    the doping concentration of the ambipolar two-dimensional material and the doping concentration of the photoactive semiconducting layer generate in the non-screening gate voltage interval a flat-band gate voltage at which the interface voltage is zero, a depletion gate voltage range where the interface voltage is nonzero, and a charge-neutrality gate voltage at which the ambipolar two-dimensional material is at its charge-neutrality point, and
    wherein the depletion gate voltage range and the charge-neutrality gate voltage lie on the same side of the flat-band gate voltage on a gate voltage axis.

2. The photosensitive device according to claim 1,
    wherein the device comprises at least one electrically conducting source electrode and at least one electrically conducting drain electrode in contact with the ambipolar two-dimensional material, and
    wherein a source-drain voltage is applied between the at least one source electrode and the at least one drain electrode, or the electric potential of the ambipolar two-dimensional material is measured through the source electrode and/or the drain electrode.

3. The photosensitive device according to claim 2, wherein a source-drain current is between the at least one source electrode and the at least one drain electrode, and corresponds to the electrical response of the photosensitive device.

4. The photosensitive device according to claim 2,
    wherein the source-drain current is fixed at a constant source-drain measurement current according to the gate voltage received at the gate electrode, and
    wherein the applied gate voltage corresponds to the electrical response of the photosensitive device.

5. The photosensitive device according to claim 1, wherein the device comprises a single-ended measurement electrode in contact with the ambipolar two-dimensional material, and that the control unit is configured to measure the electric potential of the ambipolar two-dimensional material through the measurement electrode.

6. The photosensitive device according to claim 2, wherein the electric potential of the ambipolar two-dimensional material corresponds to the electrical response of the photosensitive device.

7. A method for using a photosensitive device according to claim 1, wherein the method comprises the steps of
    exposing the photosensitive device to illumination,
    applying a capture voltage to the gate electrode, measuring a first value of the electric response at the capture gate voltage, and storing the first value of the electric response in a memory unit, applying a shutter voltage to the gate electrode, measuring a second value of the electric response at the shutter voltage, and storing the second value of the electric response in a memory unit, and calculating the corrected response of the photosensitive device from the stored first value and the stored second value.

8. The method according to claim 7, wherein the photosensitive device is a photosensitive field-effect transistor, and the electric response is the source-drain current flowing through the channel of the photosensitive field-effect transistor.

9. The method according to claim 7, wherein the photosensitive device is a voltage-mode device or a photosensitive field-effect transistor, and the electric variable is the electric potential of the ambipolar two-dimensional material.

* * * * *